United States Patent [19]

Terada et al.

[11] Patent Number: 5,321,387
[45] Date of Patent: Jun. 14, 1994

[54] ASSOCIATIVE STORAGE FOR DATA PACKETS INCLUDING ASYNCHRONOUS, SELF-RUNNING SHIFT REGISTER TRANSMISSION PATHS

[75] Inventors: Hiroaki Terada, Osaka; Katsuhiko Asada, Hyogo; Hiroaki Nishikawa, Osaka; Souichi Miyata; Satoshi Matsumoto, both of Nara; Hajime Asano, Osaka; Masahisa Shimizu, Osaka; Hiroki Miura, Osaka; Kenji Shima; Shinji Komori, both of Hyogo, all of Japan

[73] Assignees: Sanyo Electric Co., Ltd., Moriguchi; Sharp Kabushiki Kaisha, Osaka; Matsushita Electric Industrial Co., Ltd., Kadoma; Mitsubishi Denki Kabushiki Kaisha, Tokyo, all of Japan

[21] Appl. No.: 99,803

[22] Filed: Jul. 29, 1993

Related U.S. Application Data

[63] Continuation of Ser. No. 733,066, Jul. 17, 1991, abandoned, which is a continuation of Ser. No. 22,659, Mar. 6, 1987, abandoned.

[30] Foreign Application Priority Data

Mar. 10, 1986 [JP] Japan .................................. 61-52257

[51] Int. Cl.⁵ .......................... G06F 7/04; G06F 7/06
[52] U.S. Cl. ...................... 340/146.23; 365/49; 365/78; 395/425; 364/DIG. 2; 364/926.1; 364/926.5; 364/939; 364/939.7; 364/947; 364/947.2; 364/956; 364/956.1
[58] Field of Search .................. 340/146.2; 365/49, 78; 395/425

[56] References Cited

U.S. PATENT DOCUMENTS

| | | | |
|---|---|---|---|
| 3,735,362 | 5/1973 | Ashany et al. | 364/200 |
| 3,831,152 | 8/1974 | Perneski et al. | 364/900 |
| 4,034,350 | 7/1977 | Kashio | 364/900 |
| 4,236,227 | 11/1980 | Bull et al. | 365/49 |
| 4,283,771 | 8/1981 | Chang | 364/900 |
| 4,410,990 | 10/1983 | Wilkinson | 364/900 X |
| 4,486,853 | 12/1984 | Parsons | 364/900 |
| 4,636,974 | 1/1987 | Griffin | 364/900 |

Primary Examiner—Paul V. Kulik
Attorney, Agent, or Firm—Darby & Darby

[57] ABSTRACT

An associative storage comprises two data transmission paths each of which includes a self-running shift register formed in loop fashion. In the respective data transmission paths, data packets each having identification data are transmitted to respective stages of the shift register. The identification data are extracted from the data packets transmitted on the shift registers and compared with each other in a comparing circuit. If and when the identification data of two data packets respectively transmitted on the respective transmission paths are coincident, those two data packets are determined as the data packets to be paired. The data packet pair is read from the data transmission paths.

17 Claims, 14 Drawing Sheets

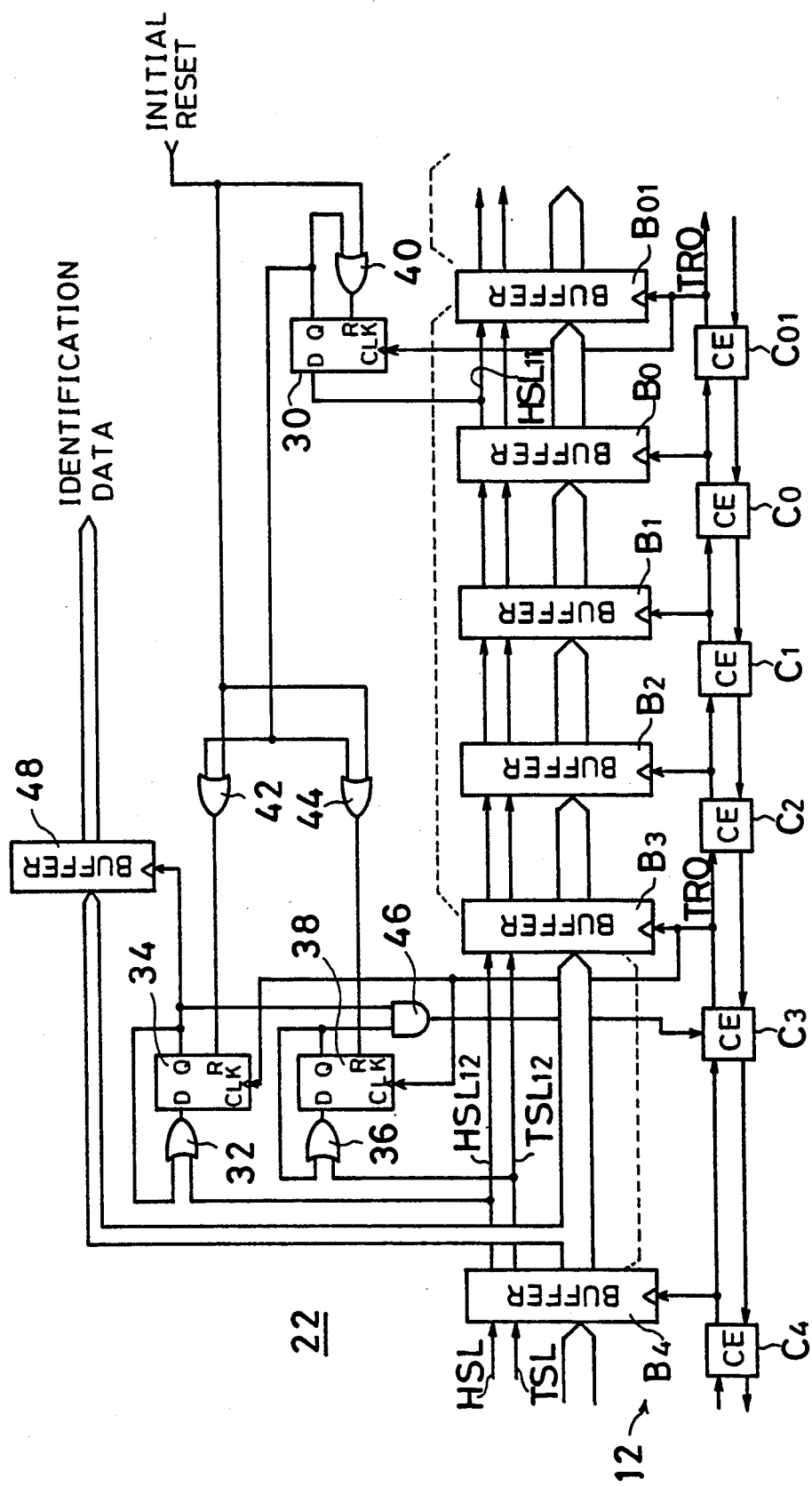
F I G. 7

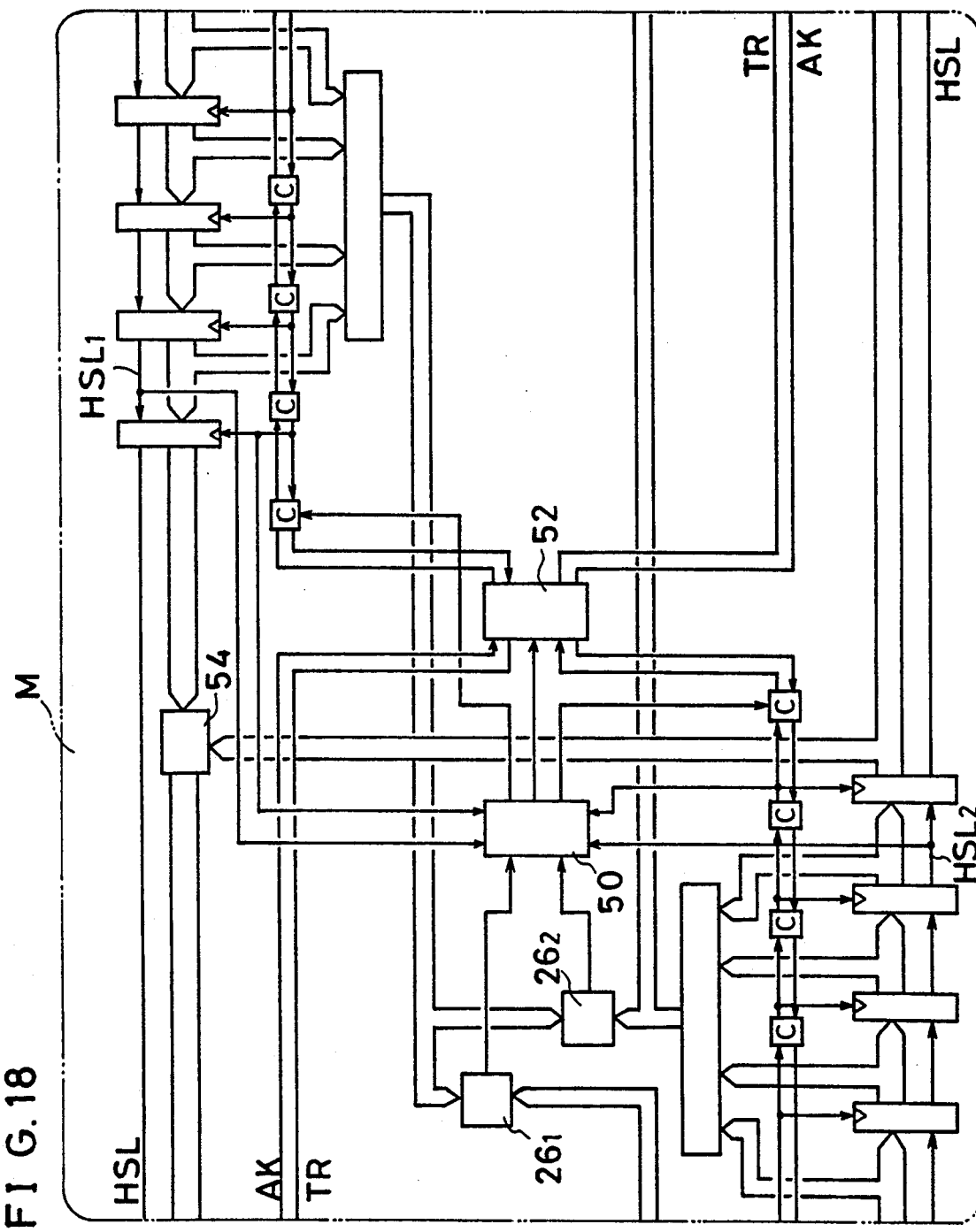

ASSOCIATIVE STORAGE FOR DATA PACKETS INCLUDING ASYNCHRONOUS, SELF-RUNNING SHIFT REGISTER TRANSMISSION PATHS

This is a continuation of application Ser. No. 07/733,066, filed Jul. 17, 1991, now abandoned, which is in turn a continuation application of Ser. No. 07/022,659 filed Mar. 6, 1987, now abandoned.

BACKGROUND OF THE INVENTION

1. Field of the Invention

The present invention relates to an associative storage. More specifically, the present invention relates to an associative storage having a novel structure in which two data packets to be paired are detected while the same are respectively transmitted on two data transmission paths, and therefore associative data packets which relate to each other are read from the data transmission paths.

2. Description of the Prior Art

Associative storage have conventionally been proposed. A conventional one of the associative storage has structure in which identification terms or identification data of data stored in a memory are searched and the counterpart data of data to be paired is found out.

In the above described conventional apparatus, since a number of data are to be stored in the memory and identification data of the data are searched in sequence, it is necessary to make a capacity of the memory large. In addition, when a length of data becomes long, it takes very long time, and consequently a speed or rate of a data processing apparatus becomes slow.

SUMMARY OF THE INVENTION

Therefore, a principal object of the present invention is to provide a novel associative storage capable of finding out the counterpart data packet of data packets to be paired faster than the conventional one.

An associative storage in accordance with the present invention comprises a first data transmission paths constituted by utilizing a shift register for transmitting data packet, a second data transmission path constituted by utilizing a shift register for transmitting data packet, and determining means coupled to the first and second data transmission paths for comparing data packets transmitted on the respective data transmission paths and for determining data packets to be paired.

In such a structure data packets are respectively transmitted on the first and second data transmission paths. The determining means extracts identification data from data packets respectively transmitted on the both data transmission paths and compares two identification data thus extracted so as to search the data packets to be paired.

In accordance with the present invention, since the data packets to be paired are detected while the same are being transmitted on the first and second data transmission data paths, the counterpart data packet of the data packets to be paired can be read out faster than the conventional one which uses a memory or memories. More specifically, in the conventional associative storage, the larger memory capacity, the longer time for searching, and therefore, a processing speed or rate being dependent on the memory capacity becomes slow. By contrast, in accordance with the present invention, for increasing or enlarging a storage capacity, only the numbers of stages of the shift register are increased, a data transmission speed or rate does not change, and therefore, the data processing speed or rate will not be affected by the storage capacity.

Furthermore, if and when the data packets are transmitted on the respective data transmission paths in reverse direction with each other, the numbers of comparing means for comparing identification data may be much less. More specifically, the conventional associative storage needs to have comparing means of the numbers equivalent to the numbers of data stored in the memory. By contrast, a preferred embodiment of the present invention, the data packets are applied to the comparing means while the same are transmitted, therefore, the numbers of such comparing means may be less than the half of the storage capacity. Thus, in accordance with the preferred embodiment, it is able to simplify and miniaturize the associative storage in the whole.

These objects and other objects, features, aspects and advantages of the present invention will become more apparent from the following detailed description of the embodiments of the present invention when taken in conjunction with accompanying drawings.

BRIEF DESCRIPTION OF THE DRAWINGS

FIG. 7 is a block diagram showing one example of an identification data detecting circuit applicable to FIG. 6 embodiment.

FIG. 18 is a block diagram showing one basic module used for FIG. 17 embodiment.

DESCRIPTION OF THE PREFERRED EMBODIMENTS

Figure 1:
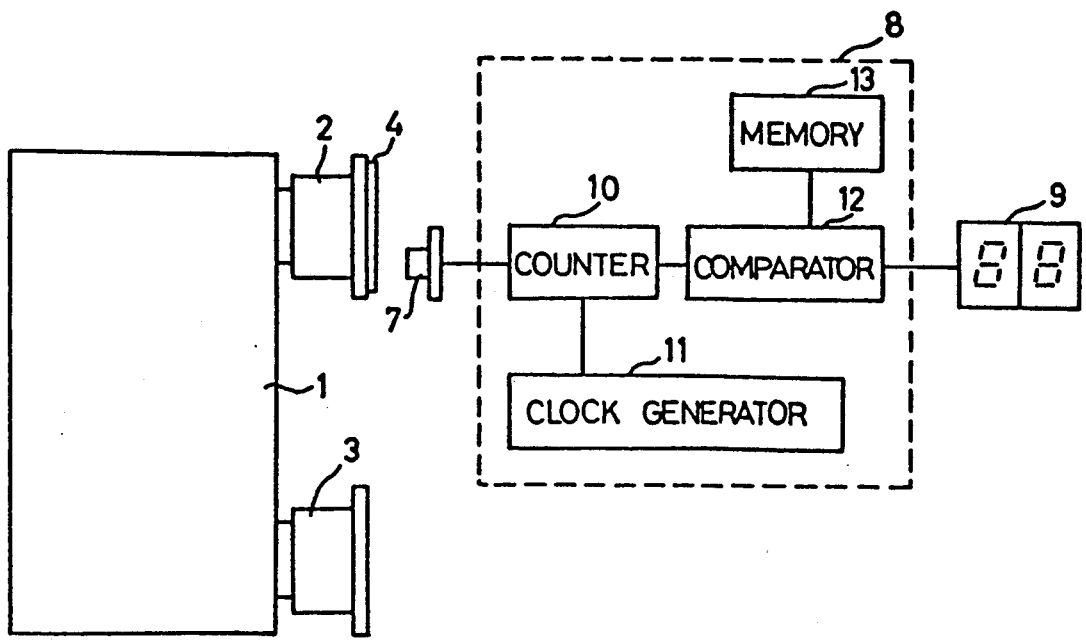
FIG. 1 is a schematic diagram showing a basic embodiment in accordance with the present invention.

FIG. 1 is a schematic block diagram showing a basic embodiment in accordance with the present invention. The first and the second loop-shaped data transmission paths 12 and 14 are shift register, being preferably constituted with self running type shift register. The self running type shift register, as described in detail later, has a plurality of data buffer registers connected in a cascade fashion and can perform independently and simultaneously push-in and pop-up of data and further therein the pushed-in data is shifted automatically in the direction of output provided that the data buffer register of a pre-stage is in the vacant state and accordingly, in this embodiment and all embodiments as described later, these first and second data transmission paths 12 and 14 are constituted as asynchronous type data transmission paths.

Meanwhile, in the system shown in FIG. 1, the data transmission paths 12 and 14 are described as ones constituting a loop. However, as described in detail later, it is desirable that at least one of them, preferably both of them are constituted in a loop fashion.

Figure 2:
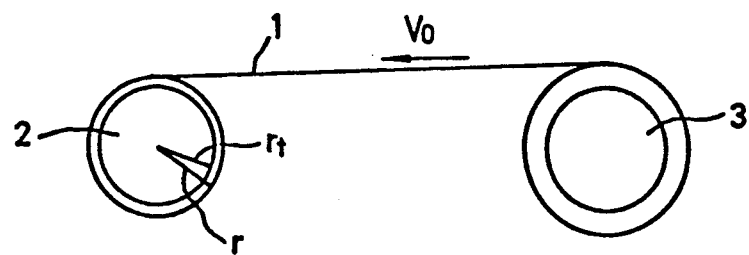
FIG. 2 is illustrative views showing an example of a data packet.

On such first and second data transmission paths 12 and 14, the data packets each having a configuration as shown in FIG. 2 are transmitted in the same direction or in the directions reverse to each other. In the data packet shown in FIG. 2, two words are included and, a portion of either one word includes an identification data.

A detecting part 16 is connected to the first and the second data transmission paths 12 and 14 and this detecting part 16 comprises a data packet pair detecting circuit 18 and a data packet reading circuit 20. The data packet pair detecting circuit 18 extracts the identification data from the data packets transmitted on the first and the second data transmission paths 12 and 14 and compares the two extracted identification data, thereby detecting the counterpart data packet to be paired. When a pair of data packets is detected, a signal is given to a data packet reading circuit 20 from this data packet pair detecting circuit 18. Responsively, the data packet reading circuit 20 takes-in the data packet comprising the detected identification data. Then, the circuit 20 reads the data packets to be paired from the two taken-in data packets and outputs it.

To be further detailed, it is assumed that data packets DP constituted as shown in FIG. 2 are transmitted on the first and the second data transmission paths 12 and 14. Data comprising identification data ID are given to the data packet pair detecting circuit 18 from these data transmission paths 12 and 14. Then, this two identification data ID are extracted to be compared. If these two identification data ID have a certain relationship, for example, if node information in the program construction or the like coincide, this is detected by a comparing circuit. Thus, in the data packet pair detecting circuit 18, the data packets are identified as ones to be paired with each other. The data packet reading circuit 20 reads the data packets thus identified from the first and the second data transmission paths 12 and 14, respectively.

Figure 3:
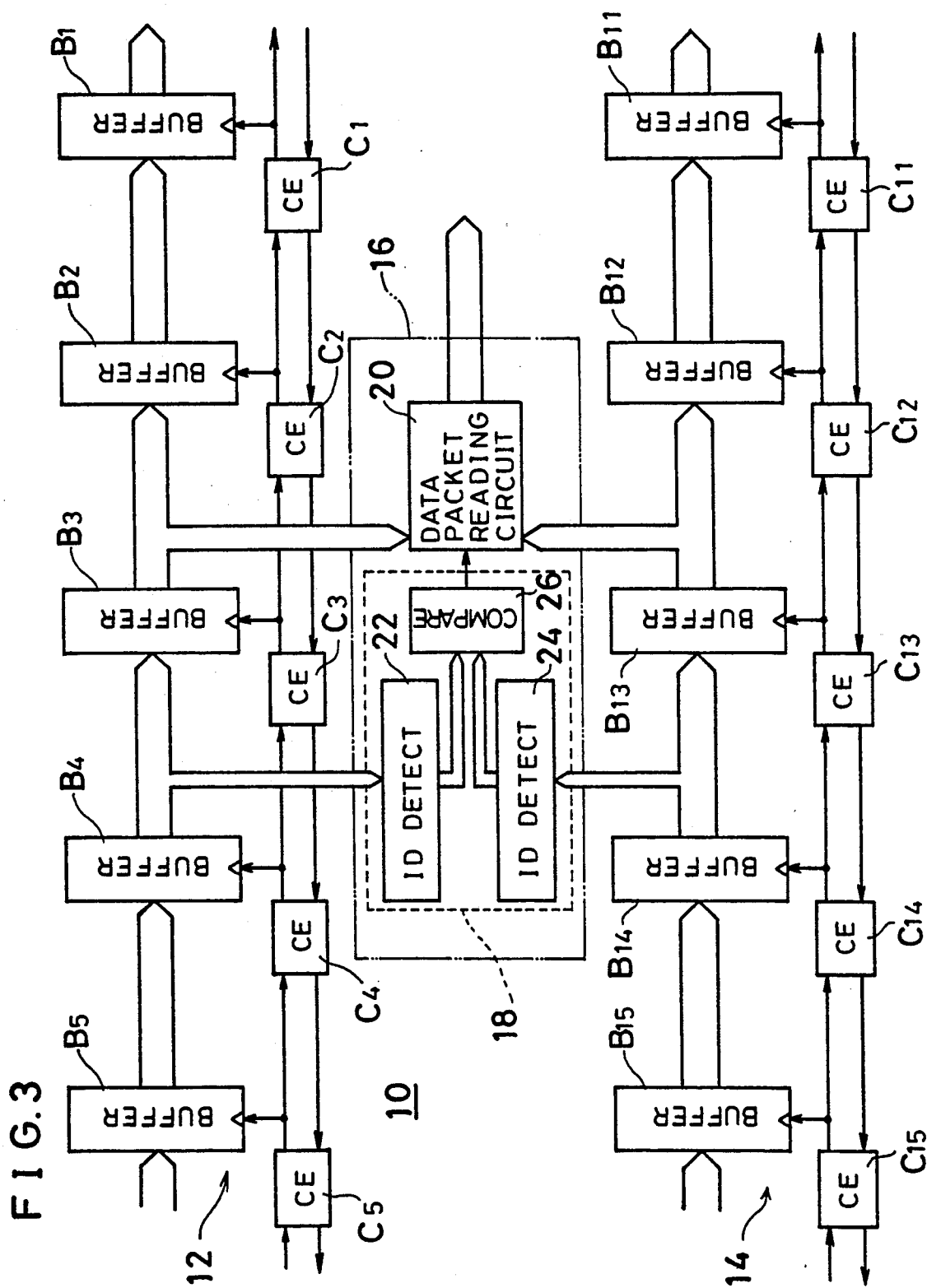
FIG. 3 is a block diagram showing one embodiment in accordance with the present invention.

FIG. 3 is a block diagram showing one embodiment in accordance with the present invention. In this embodiment shown, both of a first and second data transmission paths 12 and 14 are constituted as an asynchronous self-running type shift register. The self-running type shift register constituting the first data transmission path 12 comprises data buffer registers $B_1$-$B_5$, which are connected in a multi-stage cascade fashion and C elements (Coincidence elements) $C_1$-$C_5$, which are installed in association with the respective data buffer register. Likewise, a self-running type shift register constituting the second data transmission path 14 comprises data buffer registers $B_{11}$-$B_{15}$ connected in a cascade fashion and C elements $C_{11}$-$C_{15}$ corresponding to each thereof.

Figure 4:
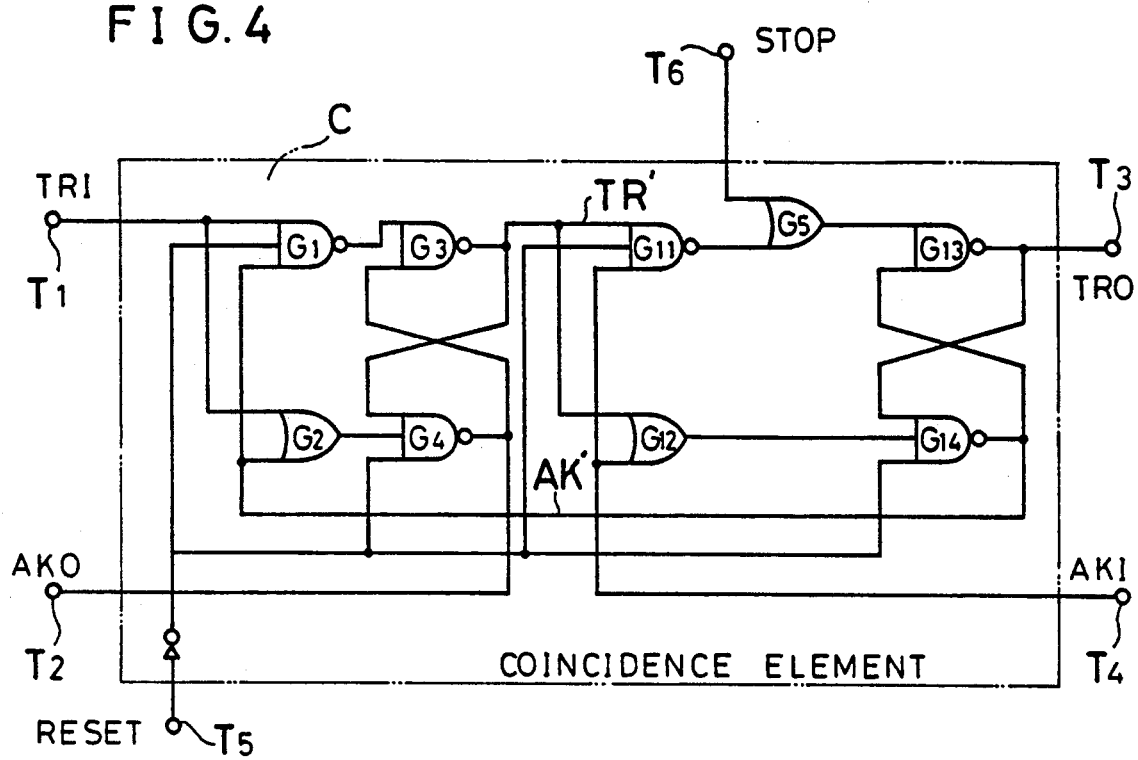
FIG. 4 is a circuit diagram showing one example of a coincidence element used for FIG. 3 embodiment.
Figure 5:
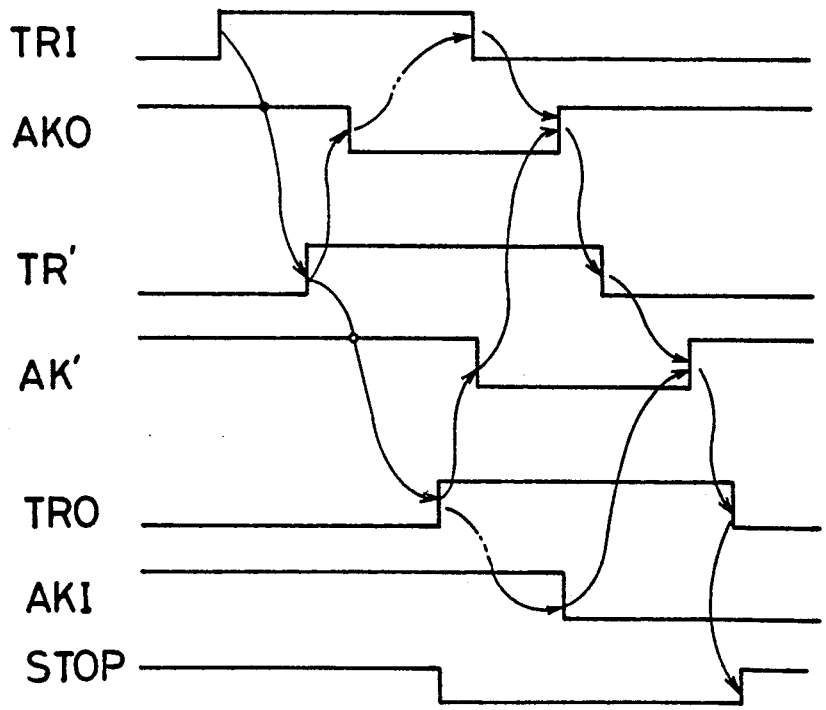
FIG. 5 is a timing chart showing an operation of the circuit in FIG. 4.

Here, description is made on the C element constituting the asynchronous self-running type shift register in reference to FIG. 4 and FIG. 5. The C element C comprises six terminals $T_1$-$T_6$, and a signal TRI (Transfer In) from the post-stage C elements is given to the terminal $T_1$, and the signal AKO (Acknowledge Out) is outputted to the post-stage C element from the terminal $T_2$. A signal TRO (Transfer Out) is outputted to the pre-stage C element from the terminal $T_3$, and a signal AKI (Acknowledge In) from the pre-stage C element is given to the terminal $T_4$. The signal TRO is further given to the corresponding data buffer register as a transfer command signal. Then, the signal AKI is given as a vacancy signal of the pre-stage data buffer register.

Meanwhile, a reset signal RESET is given to the terminal $T_5$, and a stop signal STOP is given to the terminal $T_6$.

In a circuit in FIG. 4, when the reset signal RESET is given form the terminal $T_5$, this signal is inversed by an inverter, and outputs of four NAND gates $G_1$, $G_4$, $G_{11}$ and $G_{14}$ become the high level, and accordingly outputs of NAND gates $G_3$ and $G_{13}$ receiving them go to the low level. The high level output of the NAND gate $G_4$ becomes the signal AKO, being given from the terminal $T_1$ as the signal AKI to the post-stage C element. This is a signal representing the vacant state of the pre-stage data buffer register. At this time, if no data arrives yet, the signal TRI to the terminal $T_1$ if of the low level. When the reset signal RESET to the terminal $T_5$ is released, the output of the inverter goes to the high level, while a signal AK' from the NAND gate $G_{14}$ is also of the high level, and this state is the initial state.

In the initial state, accordingly, respective outputs of the NAND gates $G_1$ and $G_{11}$ are of high level, and one of inputs of OR gates $G_2$ and $G_{12}$ is of the high level. Consequently, two inputs of the NAND gates $G_3$ and $G_{13}$ are of high level respectively, and accordingly outputs of these NAND gates $G_3$ and $G_{13}$ are of the low level respectively. This means that a signal TR' and the signal TRO from the terminal $T_3$ are of the high level. Inputs of the NAND gates $G_4$ and $G_{14}$ go to the low level, the high level and high level respectively, and outputs of these NAND gates become the high level respectively.

When data is transferred and the signal TRI to the terminal $T_1$ given from the post-stage C element is turned to the high level as shown in FIG. 5, all of three inputs of the NAND gate $G_1$ go to the high level, and the output thereof becomes the low level. Then, the output of the NAND gates $G_3$, that is, the signal TR' goes to the high level as shown in FIG. 5, and the output of the NAND gate $G_4$ goes to the low level. When the signal TR' becomes the high level, the output of the NAND gate $G_{11}$ goes to the low level, the output TRO of the NAND gate $G_{13}$ goes to the high level and the output AK' of the NAND gate $G_{14}$ goes to the low level. The outputs of the NAND gate $G_4$ and $G_{14}$ return to the inputs of the NAND gates $G_3$ and $G_{13}$ respectively, and the outputs of these NAND gates $G_3$ and $G_{13}$ are locked in the high-level state. Thus, as shown in FIG. 3, the signal AKO from the terminal $T_2$ goes to the low level and it is delivered to the post stage C element that the data has been transferred to the data buffer register corresponding to this C element, that is, transfer of the data is not accepted in this state. Also, the output of the NAND gate $G_{13}$ is of the high level, and the high-level signal TRO is given to the pre-stage C element from the terminal $T_3$. This high-level signal TRO is given as a command of transferring to the data buffer register corresponding thereto, and the data of this data buffer register is sent to the pre-stage.

When the signal AKO becomes the low level, the signal TRI goes to the low level as shown in FIG. 5, and accordingly the output TR' of the NAND gate $G_1$ returns to the high level. Furthermore, as described above, the output AK'. of the NAND gate $G_{14}$ is changed to the low level, and thereby the output AKO of the NAND gate $G_4$ returns to the high level, and the output TR' of the NAND gate $G_3$ returns to the low level.

When the signal AKO from the pre-stage C element, that is, the signal AKI given from the terminal $T_4$ is changed to the low level from the high level as shown in FIG. 5, that is, when a vacancy of the pre stage data buffer register is detected, the input of the OR gate $G_{12}$ goes to the low level, and the signal TR' is also of the low level, and therefore the output of this OR gate $G_{12}$ also goes to the low level. At this time, the output of the NAND gate $G_{13}$ is of the high level, and therefore the output of the NAND gate $G_{14}$ is changed to the high level. Consequently, the input of the NAND gate $G_{13}$ goes to the high level, and the output of the NAND gate $G_{13}$ returns to the low level. Thus, the same state as the initial state is restored. If the signal AKO from the pre-stage C elements, that is, the signal AKI from the terminal $T_4$ is kept intact at the low level, that is, if the data buffer register corresponding to the pre-stage C element is not yet in the vacant state, one input of the NAND gate $G_{11}$ is kept intact at the low level, and therefore the signal TRI from the terminal $T_1$ is given as high-level signal, and the NAND gate $G_{11}$ does not act even when the signal TR' is changed to the high level, and thereby acceptance of data from the post-stage is rejected, and accordingly no data can be transferred to the data buffer register corresponding to this C element in this state.

Thus, as shown in FIG. 3, the asynchronous self-running type shift registers of the first and second data transmission path 12 and 14 are constituted with the data buffer registers $B_1$–$B_5$ and the C elements $C_1$–$C_5$C, and also the data buffer registers $B_{11-15}$, and C elements $C_{11}$–$C_{15}$, respectively.

Meanwhile, when the stop signal STOP is given to this C element from the terminal $T_6$ in the initial state, this high-level signal makes the output of the OR gate $G_5$ to fix the high level, and the data transfer is stopped.

Reverting to FIG. 3, data lines extend from respective data transmission paths from the data buffer registers $B_4$ and $B_{14}$ to the data buffer registers $B_3$ and $B_{13}$ which constitute the first and the second data transmission paths 12 and 14 and from these data lines, respective data are given to identification data detecting circuits 22 and 24 comprised in the data packet pair detecting circuit 18. These identification data detecting circuit 22 and 24 extract the identification data from the data packet, giving it to a comparing circuit 26. The comparing circuit 26 compares the two given identification data and determines on coincidence, non-coincidence or the like of the both. When a coincidence of the two identification data is detected in the comparing circuit 26, thereby the data packets to be paired is determined and a control signal informing this determination is given to the data packet reading circuit 20.

A data packet lines extend from the transmission paths from the data buffer registers $B_3$ and $B_{13}$ to the data buffer register $B_2$ and $B_{12}$ which constitute the first and the second data transmission paths 12 and 14 to the data packet reading circuit 20 takes-in the determined specific data packets to be paired through that data packet lines based on a coincidence signal or a control signal from the comparing circuit 26. Then, the data packet reading circuit 20 combines these two data packets to produce one data packet. The data packet thus produced in the data packet reading circuit 20 is read out through a data packet lines, for example, through the data transmission path 12.

In the embodiment shown in FIG. 3, the identification data detecting circuits 22 and 24 detect the identification data within a relatively short time during which the data packets are sent from the data buffer registers $B_4$ and $B_{14}$ to the data buffer registers $B_3$ and $B_{13}$, respectively, and the comparing circuit 26 has to compare them with that time. Accordingly, there is a possibility of causing a detection error depending on the data transmitting speed on the data transmission paths 12 and 14.

Then, it is considered to adopt a configuration of holding the identification data of that data packets for a certain time in the identification data detecting circuits 22 and 24.

Figure 6:
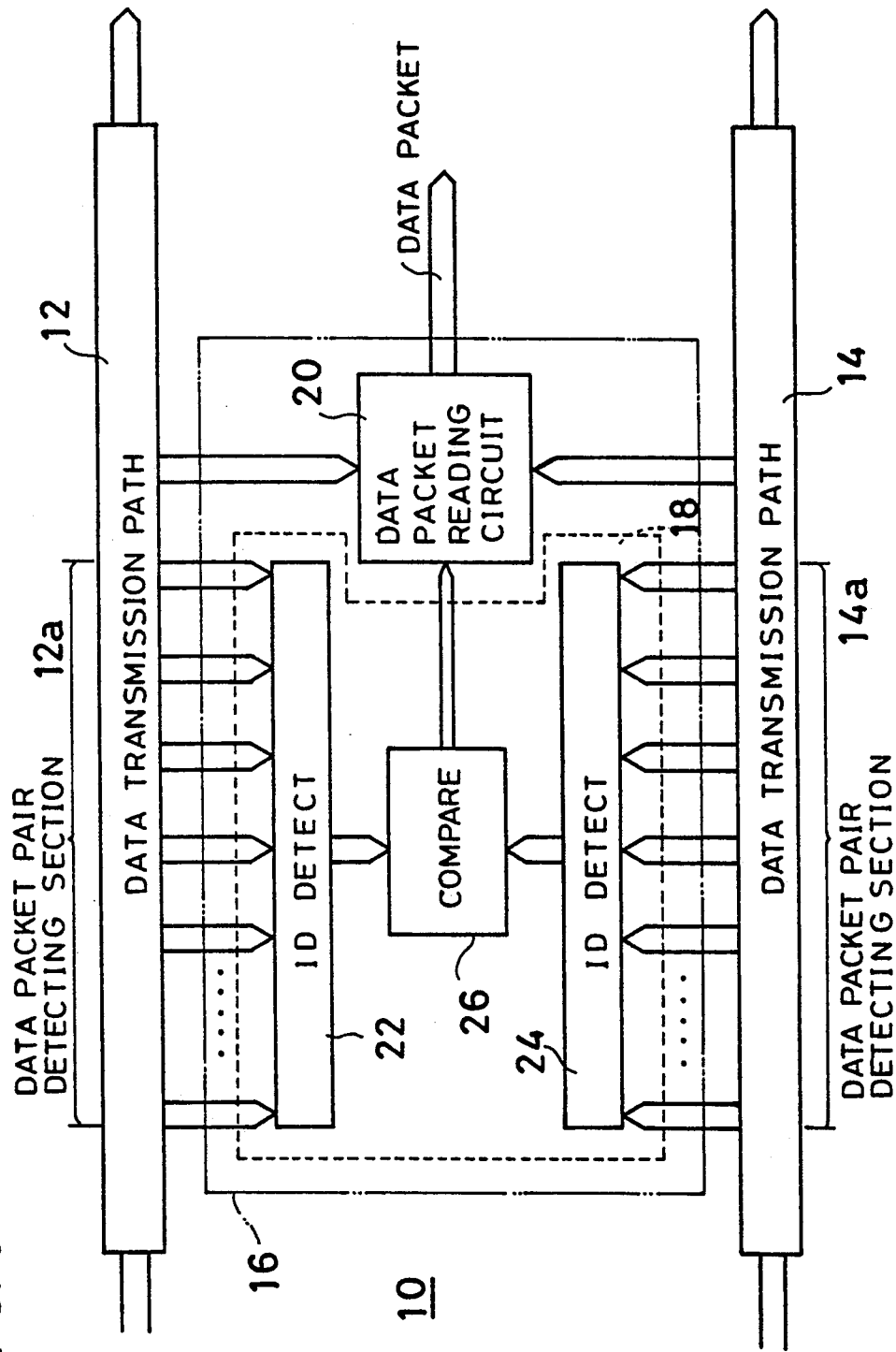
FIG. 6 is a block diagram showing another embodiment in accordance with the present invention.

FIG. 6 is a schematic block diagram showing another embodiment in accordance with the present invention. The firing part 10 of this embodiment, likewise the embodiment in FIG. 3, comprises the detecting part 16 connected to the first and the second data transmission paths 12 and 14. This detecting part 16 comprises the data packet pair detecting circuit 18 and the data packet reading circuit 20. The data packet pair detecting circuit 18 comprises the identification data detecting circuit 22 for detecting the identification data from the data packet transmitted on the first data transmission path 12 and the identification data from the data packet transmitted on the second data transmission path 14. The two identification data thus detected are compared by the comparing circuit 26. The comparing circuit 26 gives a control signal to the data packet reading circuit 20 when the both coincide or have a certain relationship therebetween.

In this embodiment, data packet pair detecting sections 12a and 14a of a certain length (a certain number of data buffer register stages) are defined on the first and the second data transmission paths 12 and 14 and an identification data is taken out from these data packet pair detecting sections 12 and 14, respectively, for a relatively long time to further facilitate the comparison in the comparing circuit 26.

FIG. 7 is a block diagram showing one example of an identification data detecting circuit applicable to FIG. 6 embodiment. FIG. 7 illustrates and explains only the first identification data detecting circuit 22 which detects the identification data from the first data transmission path 12 and it should be noticed that the identification data detecting circuit 24 detecting the identification data from the second data transmission path 14 has the same configuration.

The self-running type shift register constituting the first data transmission path 12 comprises data buffer registers $B_{01}$, $B_0$–$B_4$ which are connected in a cascade fashion and associated C elements $C_{01}$, $C_0$–$C_4$. A header signal line HSL is connected to the 18-th bit of each of the data buffer registers $B_{01}$, $B_0$–$B_4$ and a tail signal line TSL is connected to the 17-th bit of each of them, respectively. A header signal line $HSL_{11}$ between the data buffer registers $B_{01}$ and $B_0$ is given to a D input of a D flip-flop 30 and a header signal line $HSL_{12}$ between the data buffer register $B_3$ and $B_4$ is given to a D input of a D flip-flop 34 through an OR gate 36.

The signal TRO from the C element $C_{01}$ is given to a clock input of the previous D flip-flop 30. To the reset input of this D flip-flop 30, the initial reset signal is given to one of inputs of the OR gate 40. Furthermore, the output Q of the D flip-flop 30 is given to respective reset inputs of the D flip-flops 34 and 38 through OR gates 42 and 44 along with the initial reset signal. The output Q of the D flip-flop 34 is given to one of inputs of the above-described OR gate 32 whose output is given to the D input of the D flip-flop 34, also being given to one of inputs of an AND gate 46. The output Q of the D flip-flop 38 is given to the other input of this AND gate 46 and this output Q is further given to one of inputs of the OR gate 36 whose output is given to the D input of the flip-flop 38.

A header signal one is taken out from the transmission path from the data buffer register $B_4$ to the data buffer register $B_3$ and this header signal line is given to a register 48. The output Q of the previous D flip-flop 34 is given to the clock input of this register 48. Then, the output of this register 48 is given to the comparing circuit 26 (FIG. 3) as the detected identification data.

In the initial state, an initial reset signal of the high level is given. This initial reset signal is given as respective reset inputs of the D flip-flops 30, 34 and 38 through the OR gates 40, 42 and 44 and responsively, these D flip-flops 30, 34 and 38 are reset and respective data Q go to the low level. This state is the initial state.

When a vacancy of the data buffer register $B_3$ is detected by the associated C element $C_3$, the data packet starts to be transferred from the data buffer register $B_4$ to this data buffer register $B_3$. When the data packet, that is, the header thereof is transferred from the data buffer register $B_4$ to the data buffer register $B_3$, header signal line $HSL_{12}$ between them goes to the high level. Attending on start of transfer of such a data packet, the signal TRO from the C element $C_3$ goes to the high level from the low level. Then, this high-level signal is given to respective inputs of the D flip-flops 34 and 38 and the high level of the header signal line $HSL_{12}$ given to the D input of the D flip-flop 34 is written to this D flip flop 34, and the output Q of the D flip-flop 34 is turned to the high level from the low level. The high-level output from this D flip-flop 34 is given as an enable signal of the register 48 and responsively, the identification data comprised in the header outputted from the data buffer register $B_4$ is latched in the register 48. Then, this header is transmitted also to the data buffer register $B_3$.

Thereafter, the D input of the D flip flop 34 are fixed to the high level by the OR gate 32 and the output Q there is held at the high level until the next reset signal R comes.

Thereafter, the last data word transfer of the data packet starts to be transferred from the data buffer register $B_4$ to the data buffer register $B_3$. At this time, the tail signal line TSL is turned to the high level and in due time the C element $C_3$ outputs the high-level signal TRO. This high-level signal is given to the clock inputs of the D flip-flops 34 and 38 and at this time, the high level of the tail signal line TSL is given to the D input of the D flip-flop 38 through the OR gate 36. Accordingly, the output Q of the D flip-flop 38 goes to the high level at the timing when the signal TRO of the C element $C_3$ goes to the high level and the last data word is given to the data buffer register $B_3$. Also, to the D input of the D flip-flop 38 the high level of the output Q of itself is given, and therefore this D flip-flop 38 is held at the high level until the next reset signal is given.

At the moment the outputs Q of the D flip-flops 34 and 38 both go to the high level, the output of the AND gate 46 goes to the high level and the stop signal STOP (FIG. 4) is given to the C element $C_3$. Accordingly, the next data packet cannot be transferred from the data buffer register $B_4$ to the data buffer register $B_3$ until this stop signal, that is, the output of the AND gate 46 returns to the low level next.

Thereafter, the preceding header is transferred to the data buffer register $B_0$ and then the header signal line $HSL_{11}$ associated therewith goes to the high level. Then, the signal TRO of the C element $C_{01}$ goes to the high level and the the output Q of the D flip-flop 30 is turned to the high level from the low level and the header is further transferred to the pre-stage data buffer register $B_{01}$.

When the output Q of the D flip-flop 30 goes to the high level, the high-level reset signal is given to the D flip-flop 34 through the OR gates 42 and 44 and accordingly, the output Q thereof goes to the low level and the output of the AND gate 46, that is, the stop signal to the C element $C_3$ also goes to the low level. Accordingly, at this point, transfer of the new data packet to the data buffer register $B_3$ is allowed and the D flip flop 30 itself is also reset at the next moment through the OR gate 40 and this circuit 18 is returned to the initial state.

The identification data previously latched in the register 48 is held until the header of the next data packet is outputted from the data buffer register $B_4$ to the data buffer register $B_3$, that is, until the header signal line $HSL_{12}$ goes again to the high level. Accordingly, in this FIG. 7 embodiment, the identification data given to the comparing circuit 26 (FIG. 6) is held until the data transfer through four stages of data buffer registers is completed and thereby comparison between identification data in the comparing circuit 26 can be facilitated.

Figure 8:
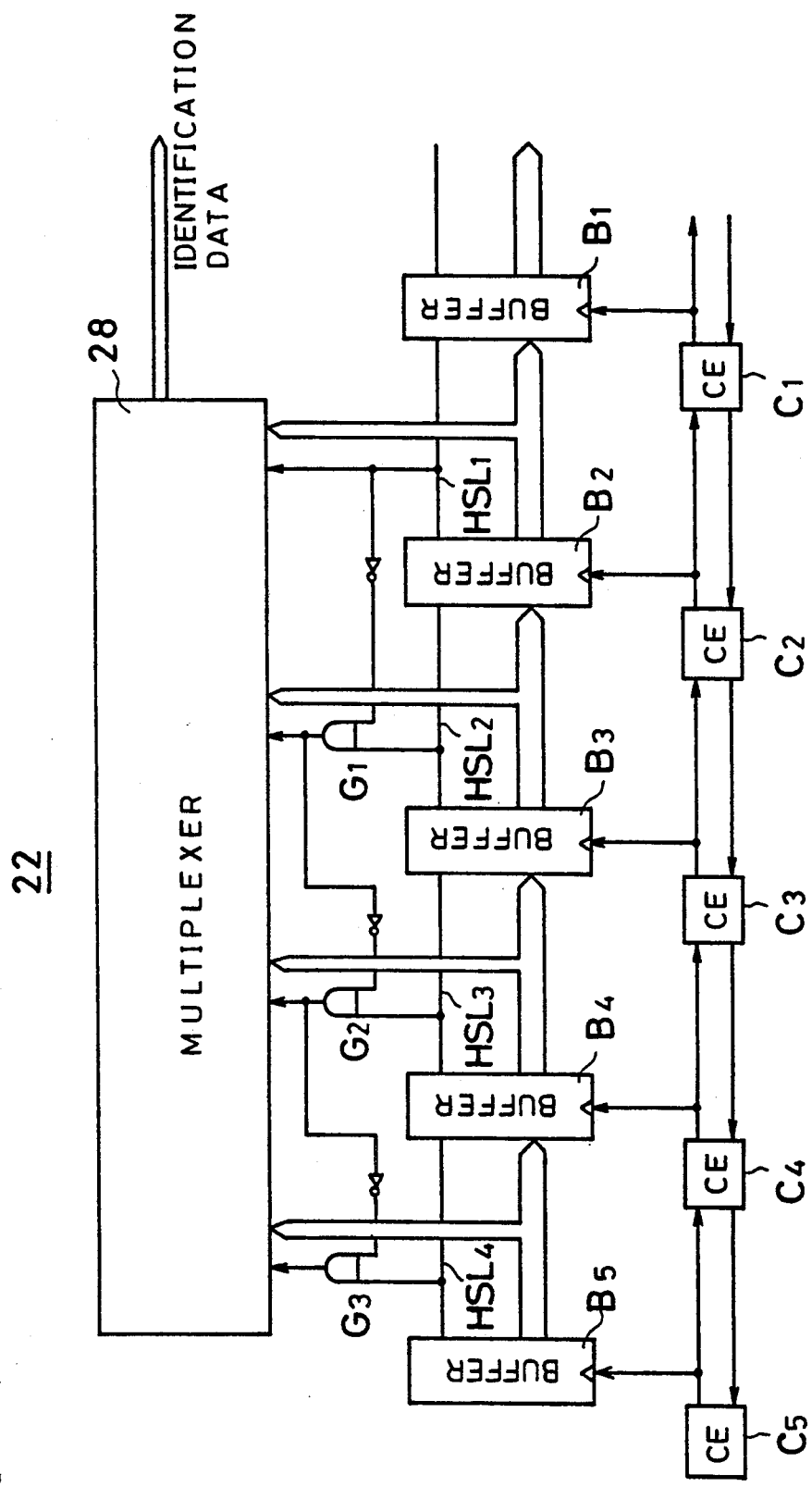
FIG. 8 is a block diagram showing another example of an identification data detecting circuit applicable to FIG. 6 embodiment.

FIG. 8 is a block diagram showing another example of an identification data detecting circuit applicable to FIG. 6 embodiment. FIG. 8, likewise FIG. 7, also illustrates and explains only the first identification data detecting circuit 22 which takes out the identification data from the first data transmission path 12.

In FIG. 8, the identification data detecting circuit 22 comprises a multiplexer 28 which receives data from data buffer registers $B_2$, $B_3$, $B_4$ and $B_5$ comprised in the first data transmission path 12. This means that outputs of four data buffer registers are inputted to the multiplexer in transferring the data packet from the post-stage data buffer register to the pre-stage data buffer register.

A header signal line HSL is connected to the 18th bit, that is, one bit of the order code of each of the data buffer registers $B_1$–$B_5$. A header signal line $HSL_1$ between the data buffer registers $B_1$ and $B_2$ is given to the multiplexer 28 and is also inverted by an inverter to be given to one of inputs of an AND gate $G_1$. The output of the AND gate $G_1$ is given to the multiplexer 28 and is also inverted by an inverter, being given to one of inputs of an AND gate $G_2$. A header signal line $HSL_3$ connected between the data buffer registers $B_3$ and $B_4$ is given to the other input of the AND gate $G_2$. The output of the AND $G_2$ is given to the multiplexer 28 and is also inverted by an inverter, being given to one of inputs of a two-input AND gate $G_3$. The output of a header signal line $HSL_4$ connected between the data buffer registers $B_4$ and $B_5$ is given to the other input of this AND gate $G_3$ and the output thereof is given to the multiplexer 28.

The outputs of these header signal line $HSL_1$ and AND gates $G_1$–$G_3$ are given as enable signal for the corresponding inputs of the multiplexer 28.

The identification data extracted from the first data transmission path 12 is given to the comparing circuit 26 (FIG. 6) from the multiplexer 28 through an identification data line.

In the initial state, all of the header signal lines $HSL_1$–$HSL_4$ are of the low level. When the header of the data packet is transferred to the data buffer register $B_5$ from the post-stage data buffer register, the header signal line $HSL_4$ goes to the high level. On the other hand, the header signal line $HSL_3$ between the data buffer registers $B_4$ and $B_3$ is still of the low level and accordingly, the output of the AND gate $G_2$ is of the low level. This low level is inverted and is given to the AND gate $G_3$ and consequently, at this point, the high level is outputted from this AND gate $G_3$.

When the output of AND gate $G_3$ goes to the high level, the corresponding input of the multiplexer 28 is enabled and the identification data from the identification line between the data buffer register $B_5$ and $B_4$ is outputted from the multiplexer 28.

Thereafter, when a vacancy of the data buffer register $B_4$ is detected by the C element $C_5$, the header of the data packet is transferred to this data buffer register $B_4$ from the data buffer register $B_5$. Responsively, the header signal line $HSL_3$ goes to the high level, the output of the AND gate $G_2$ goes to the high level likewise and the AND gate $G_3$. This high level output of the AND gate $G_2$ is inverted and is given to the AND gate $G_3$ and consequently the output of the AND gate $G_3$ is turned to the low level. On the other hand, the AND gate $G_2$ works as an enable signal of the corresponding input of the multiplexer 28, and the identification data comprised in the header transferred from the data buffer register $B_4$ to the data buffer register $B_3$ is outputted from the multiplexer 28.

When the header of the data packet is transferred to the data buffer register $B_2$ from the data buffer register $B_3$ by repeating such an operation, the header signal line $HSL_1$ goes to the high level. Consequently, the output of the AND gate $G_1$ goes the low level likewise and the AND gates $G_2$ and $G_3$. When the header signal $HSL_1$ goes to the high level, the corresponding input of the multiplexer 28 is enabled, and the identification data comprised in the data packet from the data buffer register $B_2$ is outputted from the multiplexer 28. This means that the same identification data is continuously outputted from the multiplexer 28 during transferring with the data packets placed in four data buffer registers. Thus, the identification data can be held for a certain time by using the multiplexer 28. Thus, in this embodiment, in the case where any one of the header signal lines $HSL_1$–$HSL_4$ is of the high level, the identification data existing in the foremost stage is selected.

In the case where the header of the data packet is transferred from the data buffer register $B_2$ to the foremost stage data buffer register $B_1$ and the following data words other than the header are transferred to the data buffer register $B_2$ and then the header signal line $HSL_1$ goes to the low level again and accordingly, any one of the header signal lines $HSL_1$–$HSL_4$ goes to the high level by the header of the following data packet, the identification data existing at the foremost-stage among the header signal lines $HSL_1$–$HSL_4$ is selected by the circuit constitution as described above.

In the previous example in FIG. 7, during the identification data detecting circuit holds the identification data in a certain data packet, data transfer of another data packet in the data packet pair detecting section of the corresponding data transmission path is stopped and therefore a waste of time takes place, while in an example in FIG. 8, data shift of the data transmission path is not stopped and therefore the efficiency is excellent.

Meanwhile, in an example in FIG. 8, the number of stages of the data buffer registers from which the multiplexer 28 receives data can be set arbitrarily in response to the time required.

Figure 9:
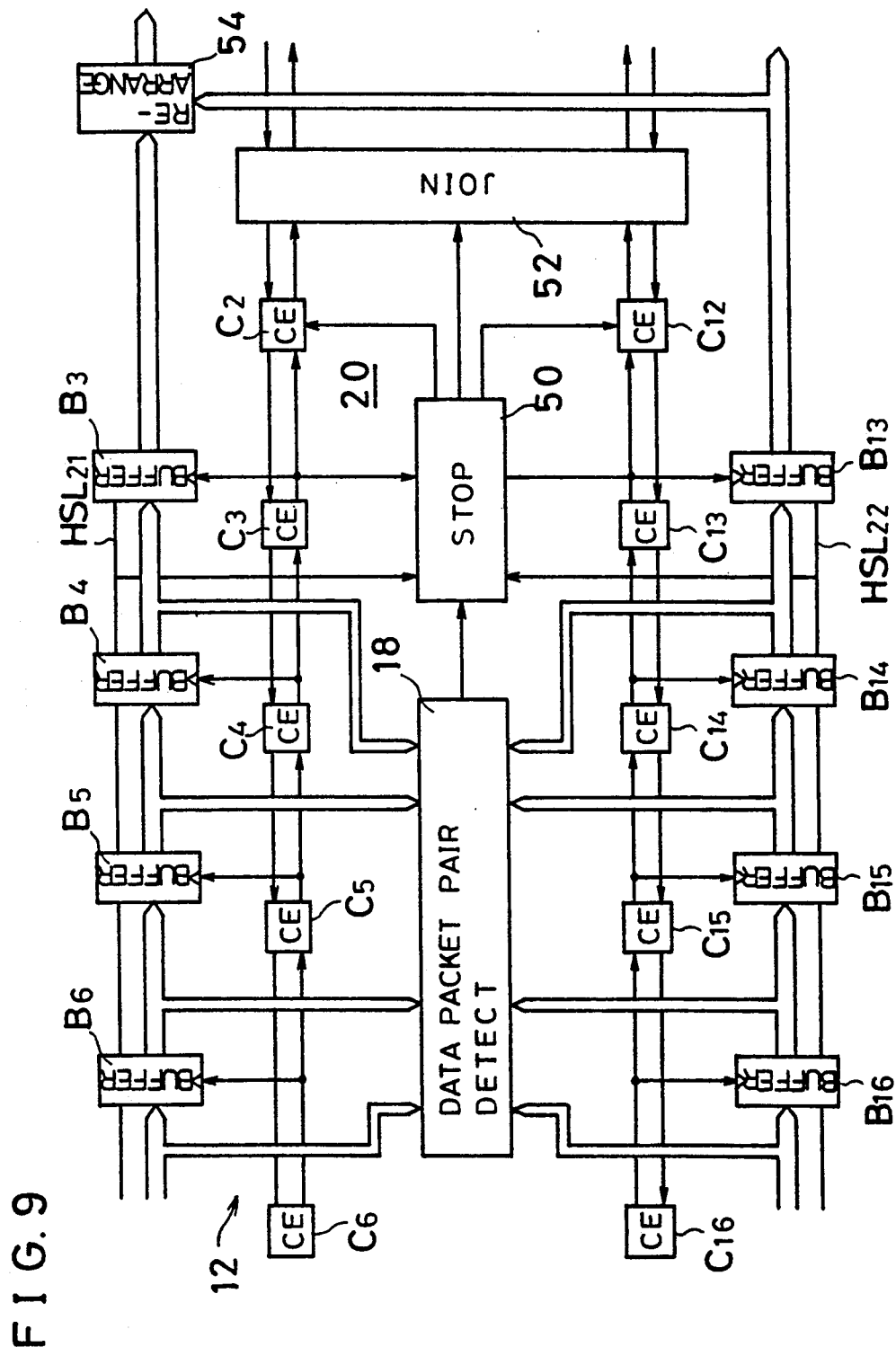
FIG. 9 is a block diagram showing still another embodiment in accordance with the present invention.

FIG. 9 is block diagram showing another embodiment in accordance with the present invention. The firing part 10 of this embodiment comprises the data packet pair detecting circuit 18 and the data packet reading circuit 20, being characterized particularly by the data packet reading circuit 20. The data packet reading circuit 20 comprises a stopping circuit 50, a joining circuit 52 and a packet rearranging circuit 54. A matching signal from the comparing circuit 26 (FIG. 3) comprised in the data packet pair detecting circuit 18 is given to the stopping circuit 50. Further, the header signal from the header signal line $HSL_{21}$ between the data buffer registers $B_3$ and $B_4$ comprised in the self-running type shift register constituting the first data transmission path 12 and the header signal from the header signal line $HSL_{22}$ between the data buffer registers $B_{13}$ and $B_{14}$ of the self-running type shift register constituting the second data transmission path 14 are given to the stopping circuit 50. Furthermore, to the data buffer registers $B_3$ and $B_{13}$, the signals TRO from the corresponding C elements $C_2$ and $C_{12}$ are given, respectively. From the stopping circuit 50, a stop signal STOP (FIG. 5) is given to the pre-stage C elements $C_2$ and $C_{12}$ and also a joining control signal is given to the joining circuit 52. The packet rearranging circuit 54 is inserted into the first data transmission path 12 and rearranges one new data packet from a pair of data packets given from the first data transmission path 12 and the second data transmission path 14, putting this recombined new packet on the first data transmission path 12. The joining circuit 52 controls the joining of the new data packet by such a packet rearranging circuit 54 onto the first data transmission path 12.

Figure 10:
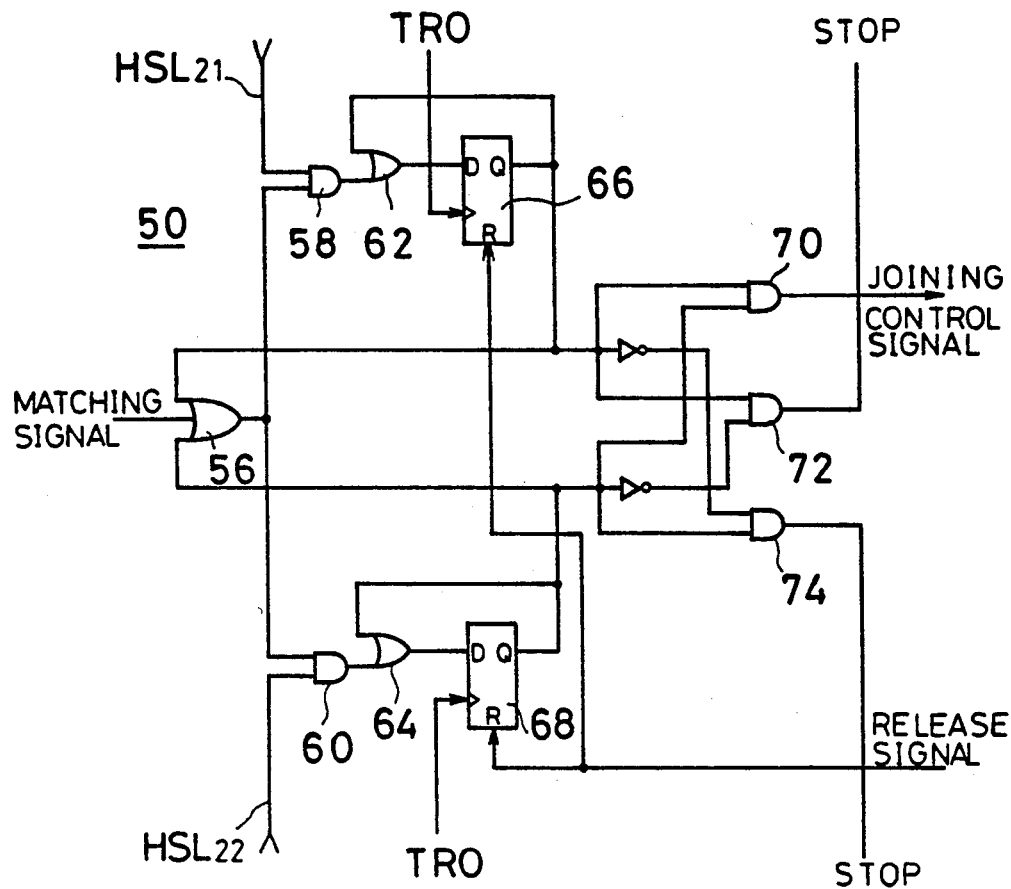
FIG. 10 is a circuit diagram showing one example of a stopping circuit of FIG. 9 embodiment.

In reference to FIG. 10, the stopping circuit 50 comprises an OR gate 86 and a matching signal from the comparing circuit 26 (FIG. 3) is given to one of inputs of this OR gate 38 and the output thereof is given to one of inputs of each of two AND gates 55 and 60. A header signal from the header signal line $HSL_{21}$ as shown in FIG. 9 is given to the other input of the AND gate 58 and a header signal from the header signal line $HSL_{22}$ is given to the other input of the AND gate 60. Outputs of these AND gates 58 and 60 are both given as D inputs of the D flip-flops 66 and 68 through AND gates 62 and 64, respectively. The signal TRO from the C element $C_3$ associated with the first data transmission path 12 is given to a clock input of this D flip-flop 66 and similarly, the signal TRO from the C element $C_{13}$ of the second transmission path 14 is given to a clock input of the D flip-flop 68. Respective outputs Q of the D flip-flops 66 and 68 are given as D inputs of themselves through the OR gates 62 and 94, also being given as the remaining input of the OR gate 56.

The output Q of the D flip-flop 66 is given intact to one of inputs of each of AND gates 70 and 72 and is inverted by an inverter, being given to one of inputs of an AND gate 74. Also, the output Q of the D flip flop 68 is given intact to the other inputs of the AND gate 70 and 74 and is also inverted by an inverter, being given to the other input of the AND gate 72. The output of the AND gate 72 is given to the C element $C_2$ of the first data transmission path 12 as the stop signal and the output of the AND gate 74 is given to the C element $C_{12}$ of the second data transmission path 14 as the stop signal STOP. Furthermore, the output of the AND gate 70 is given to the joining circuit 52 as a joining control signal.

The signal AKI is given to the above-described C element $C_2$ comprised in the first data transmission path 12 is given to the reset inputs of the D flip-flops 66 and 68 as a stop release signal.

The joining circuit 52 receives the joining control signal from the stopping circuit 50 and the joining control signal is inverted and is given to one of inputs of each of AND gates 76, 78 and 86, also being given to one of inputs of an AND gate 84. The signal TRO from the E element $C_2$ comprised in the first data transmission path 12 is given to the other input of the AND gate 76. Also, the signal TRO from the C element $C_{12}$ comprised in the second data transmission path 14 is given to the other input of the AND gate 78. Then, the output of the AND gate 76 is given to one of inputs of an OR gate 82 and to the other input of the OR gate 82, an output of an AND gate 80 to which the signals TRO from the C element $C_2$ and the C element $C_{12}$ and the joining control signal are given. The output of the OR gate 82 is given to the C element of the preceding stage. Likewise, the output of the AND gate 78 is also given to the C element of the preceding stage comprised in the second data transmission path 14. The signal AKO from that C element comprised in the first data transmission path 12 is given to the other input of an AND gate 84 and the signal AKO from the C element of the preceding stage of the second data transmission path 14 is given to the other input of an AND gate 86. The outputs of these two AND gates 84 and 86 are both given to the C element $C_{12}$ comprised in the second data transmission path 14 through an OR gate 88.

When the header of the data packet is transferred to the data buffer register $B_4$ of the first data transmission path 12, the header signal line $HSL_{21}$ goes to the high level and at this time, if a high-level matching signal is obtained from the comparing circuit 26 (FIG. 3) comprised in the data packet pair detecting circuit 18, two inputs of the AND gate 58 of the stopping circuit 50 both go to the high level and D input of the D flip-flop 66 go to the high level. Then, the signal TRO from the C element $C_3$ corresponding to the data buffer register $B_3$ further goes to the high level, that is, if this header is transferred to the data buffer register $B_3$, the D flip-flop 66 is set and the output Q thereof goes to the high level. Also, if the header is transferred to the data buffer register $B_{14}$ comprised in the second data transmission path 14, the header signal line $HSL_{22}$ goes to the high level and at this time, if the above-described coincidence signal is obtained, the D flip-flop 68 is set in response to the signal TRO from the C element $C_{13}$. This means that if the headers of the data packets to be paired arrive at the data buffer register $B_3$ of the first data transmission path 12 and the data buffer register $B_{13}$ of the second data transmission path 14, either of the D flip-flop 66 and 68, whichever earlier is first set. Then, the D flip-flop which has not been set is set without fail if the corresponding header arrives. Thus, the D flip-flops 68 and 68 are to hold the matching signal from the comparing circuit 26 of the data packet pair detecting circuit 18.

In the state that one of the D flip-flops 66 is set and the other flip-flop 68 is not set yet, that is, in the state that the corresponding header does not arrive yet at the data buffer register $B_{13}$ of the second data transmission path 14, two inputs of the AND gate 72 both go to the high level and accordingly the stop signal STOP to the terminal $T_6$ (FIG. 4) of the C element $C_2$ goes to the high level. Then, this C element $C_2$ is placed in the stopped state.

In reverse, in the state that the D flip-flop 68 is set and the D flip-flop 66 is not set yet, that is, in the state that the corresponding header does not arrive yet at the first data transmission path 12, the stop signal STOP from the AND gate 74 is outputted and consequently data transmission on the second data transmission path 14 is stopped.

Thus, synchronizing of the data packets to be paired is performed by the stopping circuit 50.

Next, in the state that the two flip-flops 66 and 68 are both set, that is, in the state that the corresponding headers have both arrive at the data buffer registers $B_3$ and $B_{13}$, one of inputs of each of the AND gates 72 and 74 goes to the low level and the stop signal STOP goes to the low level. Then, the two inputs of the AND gate 70 both go to the high level and the high-level joining control signal is outputted to the joining circuit 52. Accordingly, one of inputs of the AND gate 84 comprised in the joining circuit 52 goes to the high level and in reverse one of inputs of the AND gate 86 goes to the low level. Accordingly, the signal AKO not from the C element of the second data transmission path 14 but from the C element of the second data transmission path 14 but from the C element comprised in the first data transmission path 12 is outputted from the OR gate 88 and this signal is given as the signal AKI of the C element $C_{12}$ of the second data transmission path 14. At the same time, one of inputs of the AND gate 78 goes to the low level, the signal TRO to the C element of the preceding stage from the C element $C_{12}$ goes to the low level. Also, since the joining control signal is of the high level, the output of the AND gate 80 is enabled as the input of the OR gate 82. Accordingly, when the both signals TRO of the C element $C_2$ of the first data transmission path 12 and the C element $C_{12}$ of the second data transmission path 14 are of the high level, the high-level signal TRO is given to the C element of the prestage of the first data transmission path 12. Accordingly, thereafter, the data packet on the second data transmission path 14 is given to the packet rearranging circuit 54 installed in the first data transmission path 12 and disappears from the second data transmission path 14.

Packet rearrangement is performed in the data packet rearranging circuit 54 and the new data packet is brought on the first data transmission path 12 from it and thereafter the high-level stop release signal is given to the stopping circuit 50 and the D flip-flop 66 and 68 are both reset and accordingly, the data packet reading circuit 20 is disabled. Thus, coincidence of the data packets to be paired is detected and the data packets are read out.

Figure 12:
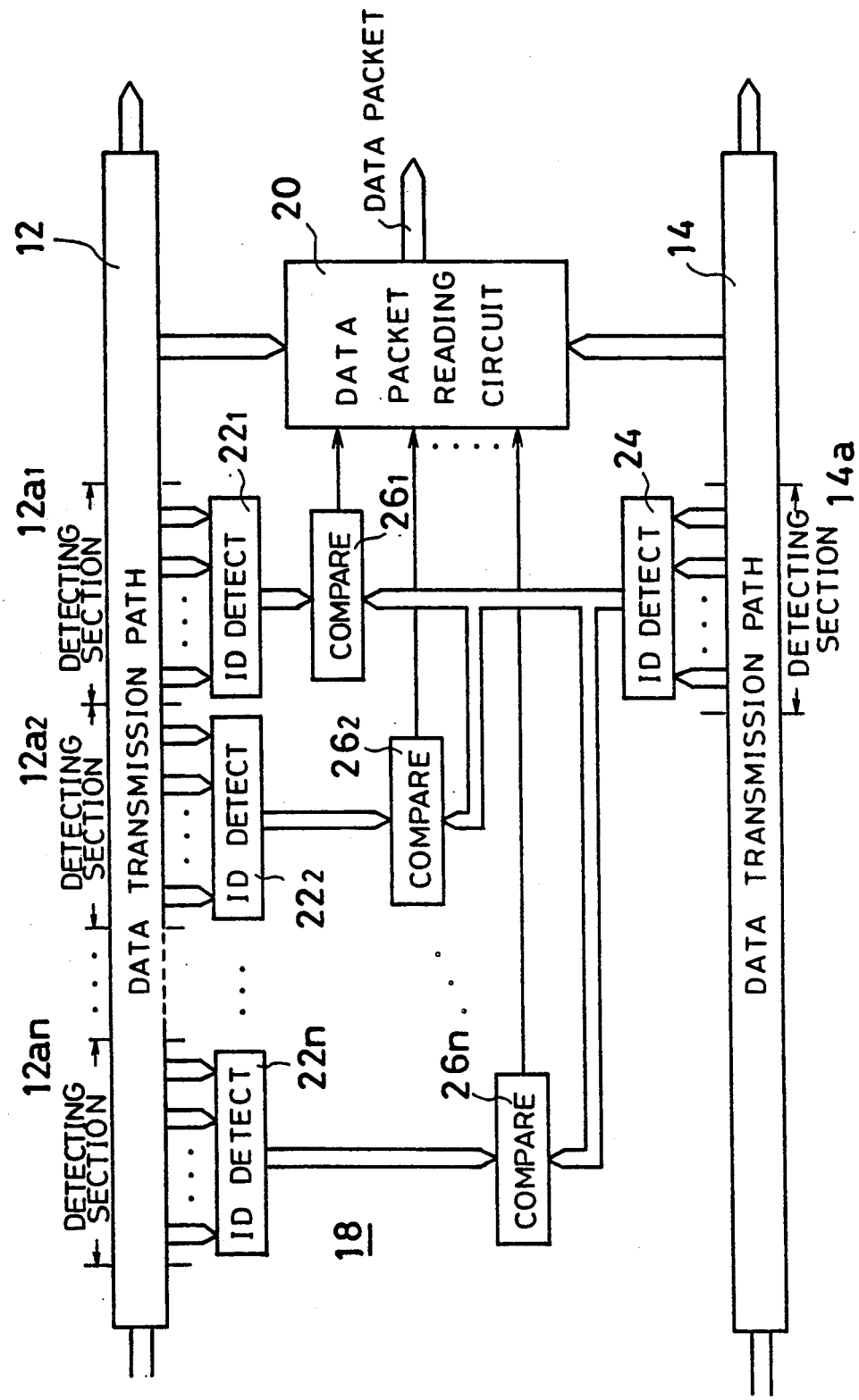
FIG. 12 is a block diagram showing a further embodiment in accordance with the present invention.

FIG. 12 is a block diagram showing another embodiment in accordance with the present invention. This FIG. 12 embodiment is effective for preventing the so-called "deadlock" that the data packets to be paired cannot be found forever.

Figure 13:
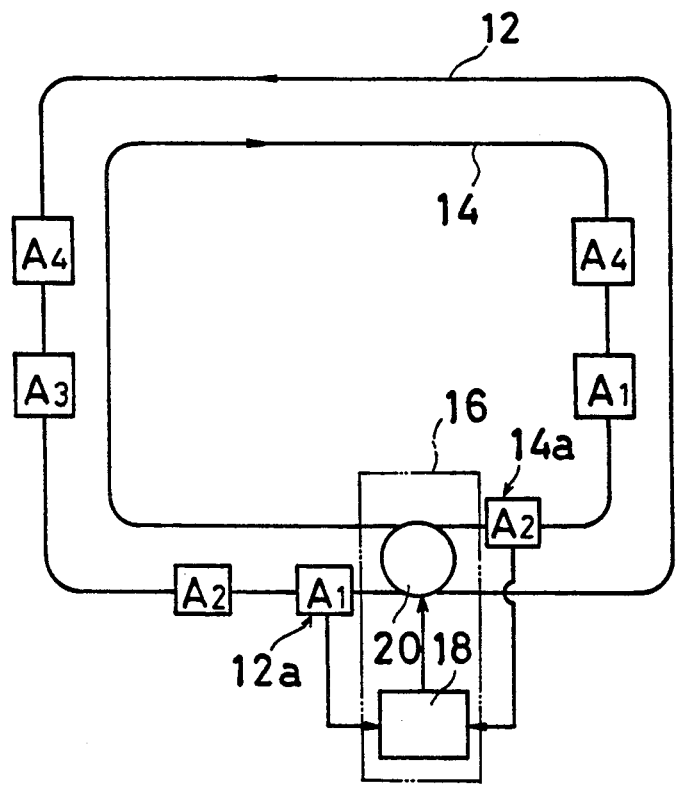
FIG. 13 and FIG. 14 are schematic views showing data flow for explaining the concept of FIG. 12 embodiment.

To be described in detail, in either of the previous embodiments in FIG. 3 and FIG. 6, as shown in FIG. 13, only one data packet pair detecting section 12a or 14a is defined on the data transmission path 12 or 14. In the case where only one data packet pair detecting section is provided on each path, as shown in FIG. 13, when data shifts are performed in the directions reverse to each other on the respective data transmission paths 12 and 14 and the data packets are circulated on the two data transmission paths 12 and 14 at the same transferring speed and in the sequence as illustrated, the same identification data, for example, "$A_1$" can never be detected simultaneously in the respective data packet pair detecting sections 12a and 14a. Accordingly, the so-called "deadlock" takes place in such a case.

Figure 14:
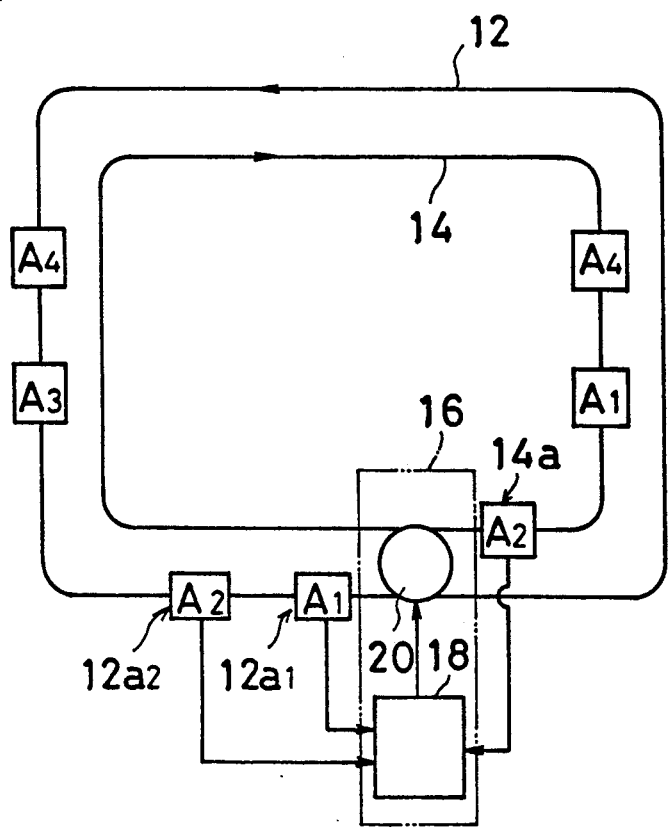

On the other hand, as shown in FIG. 14, if a plurality of data packet pair detecting sections $12a_1$, $12a_2$, --- are defined on at least one of the data transmission paths 12, the "deadlock" can be avoided effectively. Because, even if the data are transferred on the both data transmission paths 12 and 14 at the same transferring speed and in the directions reverse to each other and the sequence as illustrated, an opportunity occurs without fail that when the identification data, for example, "$A_2$" is present in the data packet pair detecting section 14a of the data transmission path 14, the same identification data "$A_2$" is present in either of the other data packet pair detecting sections $12a_1$ and $12_2$. Accordingly, the "deadlock" can be avoided by defining a plurality of data packet pair detecting sections on either of the data transmission paths.

In FIG. 12, a plurality of data packet pair detecting sections $12a_1$, $12a_2$, ---, $12a_n$ are provided on the first data transmission path 12 and one data packet pair detecting section 14a is defined on the second data transmission path 14. A plurality of identification data detecting circuits $22_1$-$22_n$ are installed corresponding to the data packet pair detecting sections $12a_1$-$12a_n$ of the first data transmission path 12, while one identification data detecting circuit 24 is installed corresponding to the data packet pair detecting section 14 of the second data transmission path 14. Then, the identification data from the identification data detecting circuits $22_1$-$22_n$ associated with the first data transmission path 12 are given individually to one of inputs of the corresponding comparing circuits $22_1$-$22_n$, respectively. The identification data from the identification data detecting circuit 24 of the second data transmission path 14 is given to the other inputs of these comparing circuits $26_1$-$26_n$ in common. Then, if a coincidence of the identification data is detected in the respective comparing circuits $26_1$-$26_n$, the control signal is given to the new data packet producing circuit 20 from the corresponding comparing circuit. In response to the coincidence signal, the new data packet producing circuit 20 produces one new data packet from the two coincident data packets, for example, likewise the case of FIG. 9 embodiment.

In addition, in the FIG. 12 embodiment, illustration and explanation are made such that the two data transmission paths 12 and 14 both transmit data in the same direction, but it is needless to say that a reverse-looped configuration may be adopted as shown in FIG. 14.

Figure 15:
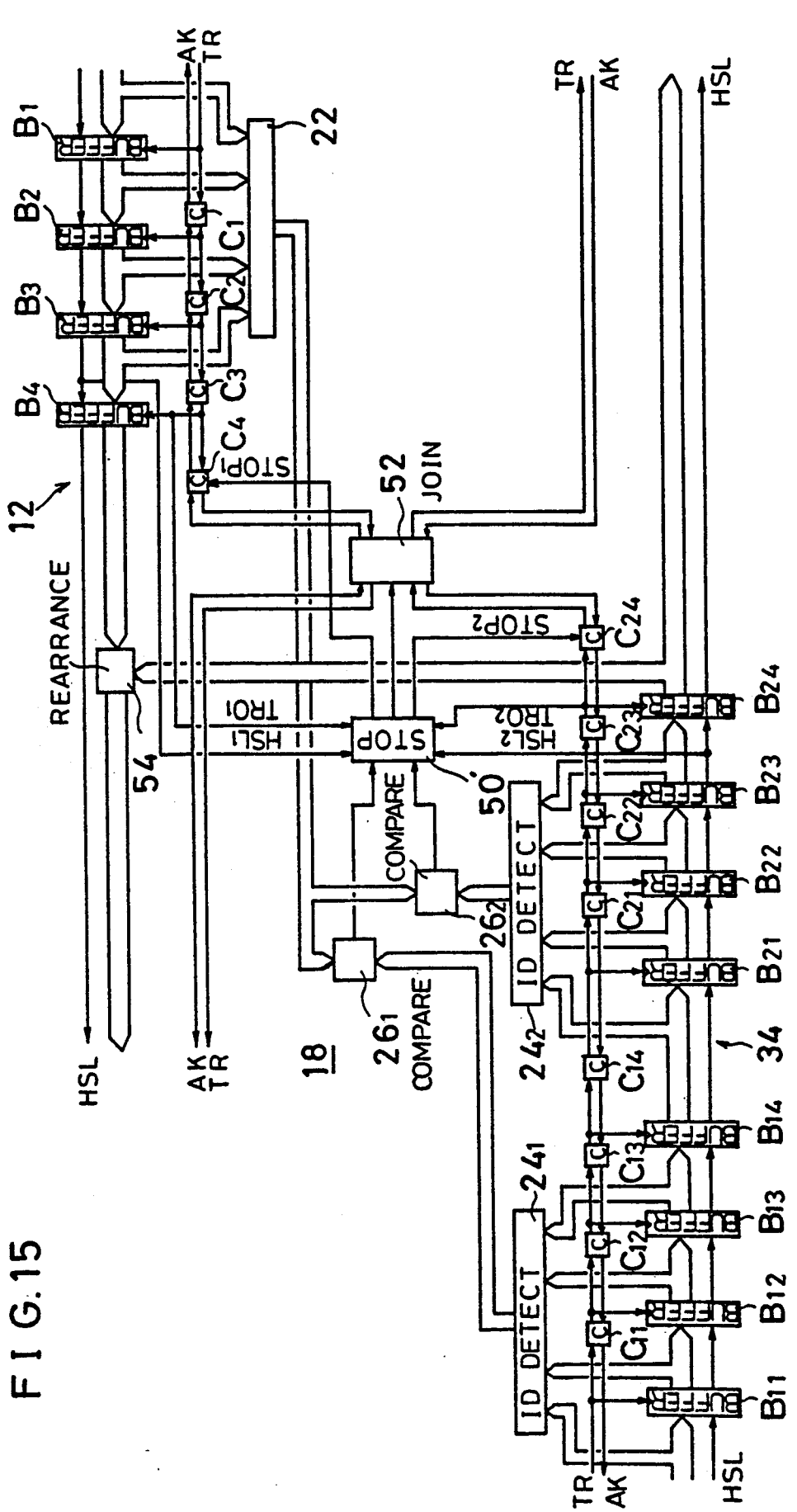
FIG. 15 is a block diagram showing one example embodying FIG. 12 embodiment, that is, FIG. 14.

FIG. 15 is a block diagram showing an example embodying FIG. 12 embodiment, that is, FIG. 14. In this FIG. 15 embodiment, one identification data detecting circuit 22 is installed in association with one of data transmission paths 12 and two identification data detecting circuits $24_1$ and $24_2$ are installed in association with the other data transmission path 14. To be detailed, the identification data detecting circuit 22 extracts the identification data from the input data to the four register $B_1$–$B_4$ constituting the first data transmission path 12. The identification data detecting circuits $24_1$ and $24_2$ respectively extract the identification data from the input data to the data buffer registers $B_{11}$–$B_{14}$ and the input data to the data buffer registers $B_{21}$–$B_{24}$ which constitute second the data transmission path 14. The identification data detected by the identification data detecting circuit 22 is given to the two comparing circuits $26_1$ and $26_2$ in common. The identification data detected by the identification data detecting circuits $24_1$ and $24_2$ are given individually to the corresponding comparing circuits $26_1$ and $26_2$, respectively.

The two comparing circuits $26_1$ and $26_2$ compare the both identification data to be given to find a matching thereof and the matching signals thereof are given to the stopping circuit 50', respectively. The stopping circuit 50' is for synchronizing the data packets to be paired which are transmitted on the two data transmission paths 12 and 14, being closely similar to the one as illustrated in FIG. 10. Then, the control signal is given to the joining circuit 52 from the stopping circuit 50' and the joining circuit 52 sends the new data packet on the first data transmission path 12 in cooperation with the packet rearranging circuit 54.

The header signal from the header signal line $HSL_1$ between the data buffer registers $B_3$ and $B_4$ constituting the first data transmission path 12 and the header signal from the header signal line $HSL_2$ between the data buffer registers $B_{23}$ and $B_{24}$ constituting the second data transmission path 14 are given to the stopping circuit 50'. Furthermore, the signals $TRO_1$ and $TRO_2$ from the C elements $C_3$ and $C_{23}$ corresponding respectively to the data buffer registers $B_3$ and $B_{23}$ are given thereto.

From the stopping circuit 50', the stop signals $STOP_1$ and $STOP_2$ are given to the pre-stage C elements $C_4$ and $C_{24}$ respectively and the joining control signal is given to the joining circuit 52.

Figure 16:
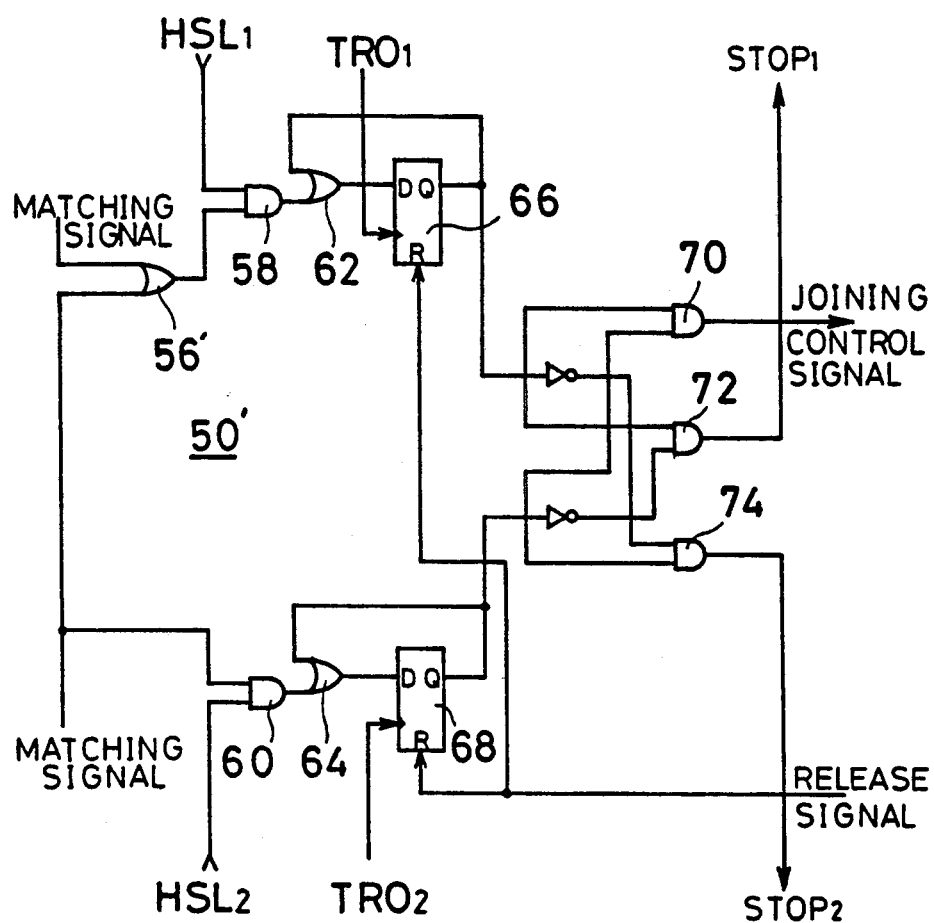
FIG. 16 is a circuit diagram showing a stopping circuit of FIG. 15 embodiment.

As shown in FIG. 16, the stopping circuit 50' comprises an OR gate 56 and two matching signals from the comparing circuits $26_1$ and $26_2$ are given to two inputs of this OR gate 56 and the output thereof is given to one of inputs of the AND gate 58. The header signal from the header signal one $HSL_1$ is given to the other input of the AND gate 58. The matching signal 1 and the header signal from the header signal line $HSL_2$ are given to two inputs of the AND gate 60. Outputs of these AND gates 58 and 60 are given as D inputs of the D flip-flops 66 and 68 through the OR gates 62 and 64, respectively. The signal $TRO_1$ from the C element $C_3$ associated with the first data transmission path 12 is given to the clock input of this D flip-flop 66 and similarly, the signal $TRO_2$ from the C element $C_{23}$ of the second data transmission path 14 is given to the clock input of the D flip-flop 68. Respective outputs Q of the D flip-flops 66 and 68 are given as D inputs of themselves through the OR gates 62 and 64.

The output Q of the D flip-flop 66 is given intact to one of inputs of each of the AND gates 70 and 72 and is also inverted by an inverter, being given to one of inputs of the AND gate 74. Also, the output Q of the D flip-flop 68 is given intact to the other inputs of the AND gates 70 and 74 and is also inverted by an inverter, being given to the other input of the AND gate 72. The output of the AND gate 72 is given to the C element $C_4$ of the first data transmission path 12 ass a stop signal $STOP_1$ and the output of the AND gate 74 is given to the C element $C_{24}$ of the second data transmission path 14 as a stop signal $STOP_2$. Furthermore, the output of the AND gate 70 is given to the joining circuit 52 as a joining control signal.

Also, the stop release signal is given to the reset inputs of the D flip-flops 66 and 68.

Figure 11:
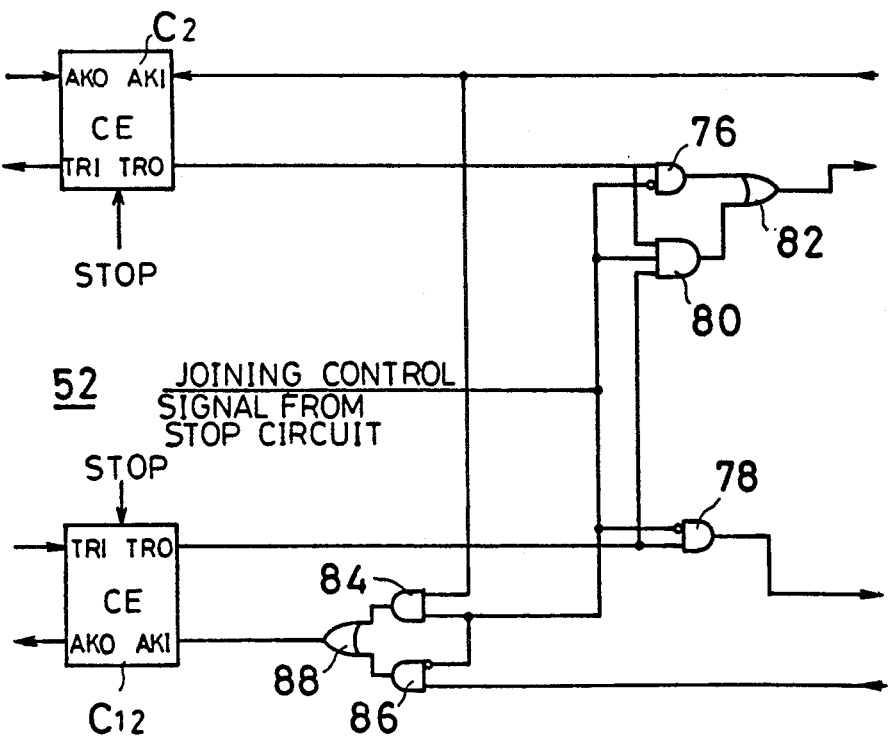
FIG. 11 is a circuit diagram showing one example of a joining circuit of FIG. 9 embodiment.

The joining circuit 52 and the data packet rearranging circuit 54 are similar to the ones as illustrated in FIG. 11.

When the header of the data packet is transferred to the data buffer register $B_3$ of the first data transmission path 12, the header signal line $HSL_1$ goes to the high level and at this time, if the high-level matching signal is obtained from the comparing circuit $26_1$ or $26_2$ comprised in the data packet pair detecting circuit 18, two inputs of the AND gate 58 of the stopping circuit 50' both go to the high level and D inputs of the D flip-flop 66 go to the high level. At this time, the signal $TRO_1$ from the C element $C_3$ goes to the high level and D flip-flop 66 is set and the output Q thereof goes to the high level. Also, when the header is transferred to the data buffer register $B_{23}$ comprised in the second data transmission path 14, the header signal line $HSL_2$ goes to the high level and at this time, if the matching signal is obtained from the comparing circuit $26_2$, the D flip-flop 68 is set in response to the signal $TRO_2$ from the C element $C_{23}$. This means that when the headers of the data packets to be paired arrive at the data buffer register $B_3$ of the first data transmission path 12 and the data buffer register $B_{23}$ of the second data transmission path 14, either of the D flip-flops 66 and 68, whichever earlier, is first set. Then, the D flip-flop which is not set is set without fail when the corresponding data arrives. Thus, the D flip-flops 66 and 68 are to hold the matching signals from the comparing circuits $26_1$ and $26_2$ of the data packet pair detecting circuit 18.

In the state that one of the D flip-flops 66 is set and the other D flip-flop 68 is not set yet, that is, in the state that the corresponding header does not arrive yet at the data buffer register $B_{23}$ of the second data transmission path 14, two inputs of the AND gate 72 of the stopping circuit 50' both go to the high level and accordingly, the stop signal $STOP_1$ to the terminal $T_6$ (FIG. 5) of the C element $C_4$ goes to the high level. Then, this C element $C_2$ is placed in the stopped state.

In reverse, in the state that the D flip-flop 68 is set and the D flip-flop 66 is not set, that is, in the state that the corresponding header does not arrive yet at the first data transmission path 12, the stop signal $STOP_2$ is outputted from the AND gate and consequently data transmission on the second data transmission path 14 is stopped.

In the state that the two flip-flops 66 and 68 are both set, that is, in the state that the corresponding headers have both arrived at the data buffer registers $B_3$ and $B_{23}$, one of inputs of each of the AND gates 72 and 74 goes to the low level and the stop signals $STOP_1$ and $STOP_2$ both go to the low level. Responsively, two inputs of the AND gate 70 both go to the high level and the high-level joining control signal is outputted to the joining circuit 52. Accordingly, one of inputs of the AND gate 84 (FIG. 11) comprised in the joining circuit 52 goes to the high level and in reverse, one of inputs of the AND gate 86 goes to the low level. Accordingly, the signal AKO not from the C element of the second data transmission path 14 but from the C element comprised in the first data transmission path 12 is outputted from the OR GATE 88 (FIG. 11) and this signal is given as the signal AKI of the C element $C_{24}$ of the second data transmission path 14. At the same time, one of inputs of the AND gate 78 (FIG. 11) goes to the low level and the signal TRO to the C element of the pre-stage from the C element $C_{24}$ goes to the low level. Also, since the joining control signal is of the high level, the output of the AND gate 80 is enabled as an input of the OR gate of the joining circuit 52 (FIG. 11). Accordingly, when the both signals $TRO_1$ and $TRO_2$ of the C element $C_4$ of the first data transmission path 12 are of the high level, the high-level signal TRO is given to the pre-stage C element of the first data transmission path 12 from the OR gate 82. Accordingly, thereafter the data packet of the second data transmission path 14 is given to the packet rearranging circuit 54 installed on the first data transmission path 12, disappearing from the second data transmission path 14.

Rearrangement of the data packets is performed in the data packet rearranging circuit 54 and therefrom a new data packet is brought onto the first data transmission path 12 and thereafter the high-level stop release signal is given to the stopping circuit 50' and the D flip-flops 66 and 68 are both reset and accordingly, the new data packet producing circuit 20 is disabled. Thus, a matching of the data packets to be paired is detected and one new data packet is produced.

Figure 17:
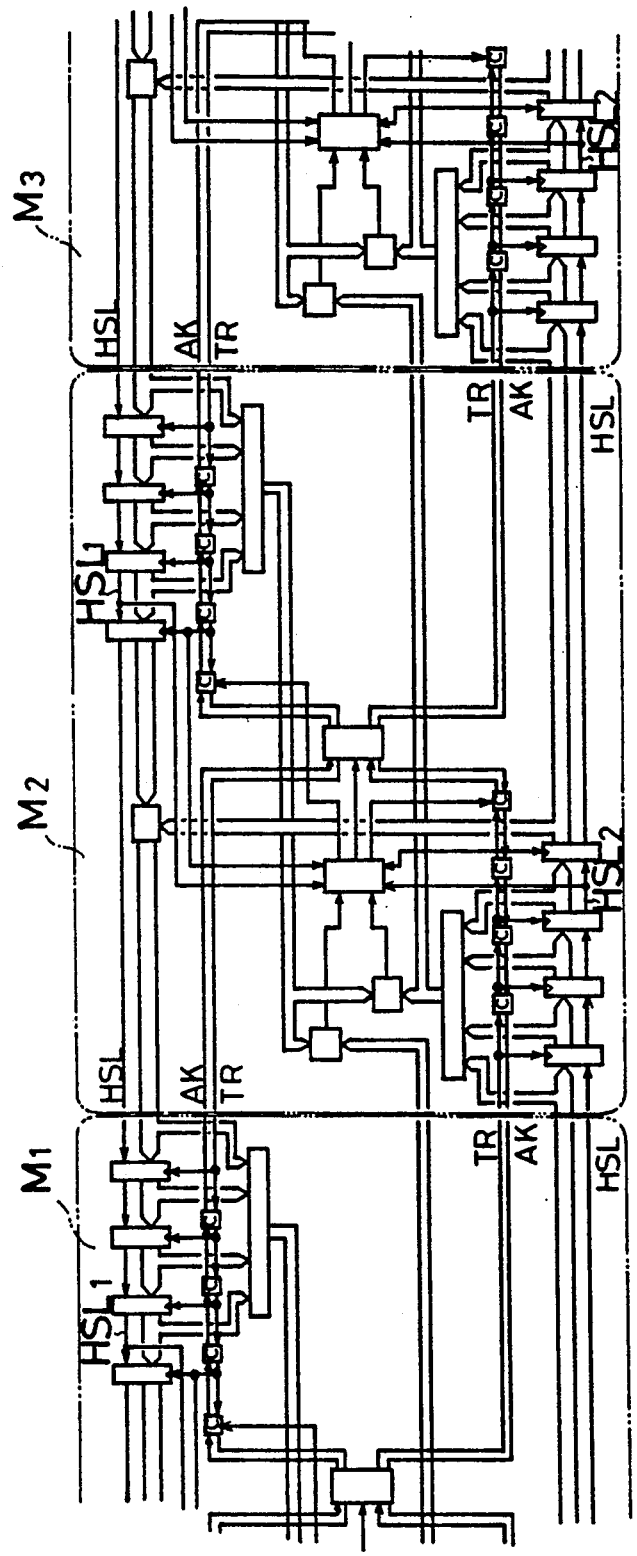
FIG. 17 is a block diagram showing another example embodying FIG. 12 embodiment, that is, FIG. 14.

FIG. 17 show a modification of FIG. 15 embodiment, which is similarly an example embodying FIG. 12 embodiment, that is FIG. 14. This embodiment is constituted by connecting a plurality of basic modules $M_1$, $M_2$, $M_3$, - - - in a cascade fashion. FIG. 18 shows a basic module M. Since the basic module M resembles closely to the circuit in FIG. 15, detailed description thereon is omitted here. In this case, the identification data can be extracted from two different data packet p@air detecting sections of the second data transmission path 14 by two identification data detecting circuits.

Aiming at a certain basic module $M_2$ a coincidence is obtained in the comparing circuit $26_2$ (FIG. 18) when the two data packets to be paired are both transferred to that module $M_2$. On the other hand, a coincidence is obtained in the comparing circuit $26_1$ when the data packet on the first data transmission path (upper data transmission path in the figure) among the two data packets to be paired exists in that module $M_2$ and the data packet on the second data transmission path (lower data transmission path in the figure) exists in the module M next thereto (left side in the figure). This means that the data packet existing in the four data buffer registers constituting the upper data transmission path is made to wait until the counterpart data packet arrives at that module $M_2$ when the counterpart data packet existing on the lower data transmission path is transferred into the eight-stage data buffer registers comprising the adjacent module. In reverse, the data packet existing on the lower data transmission path is made to wait until the counterpart data packet arrives at that module $M_2$ only when the counterpart data packet is transferred into the same module $M_2$.

Thus, in accordance with FIG. 17 embodiment, two data packets exist in two data packet pair detecting sections of the lower data transmission path and one data packet exists in one data packet pair detecting section of the upper data transmission path are compared only by connecting a plurality of basic modules $M_1$, $M_2$, $M_3$, - - -in a cascade fashion and likewise the case of FIG. 15, the "deadlock" due to "pass-each-other" of data can be eliminated completely.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An associative storage device for data packets each including bits of identification data and a plurality of additional bits of data associated with and yet different from the identification data, comprising:

first data transmission path means for transmitting the data packets, said first data transmission path means including a plurality of bit-parallel data buffers interconnected in a cascade fashion so as to constitute a multi-state, asynchronous, self-running shift register in which the data packets are sequentially shifted in a bit-parallel fashion in response to vacancy of a pre-stage data buffer;

second data transmission path means for transmitting the data packets, said second data transmission path means including a plurality of bit-parallel data buffers interconnected in a cascade fashion so as to constitute a multi-stage, asynchronous, self-running shift register in which h data packets are sequentially shifted in a bit-parallel fashion in response to vacancy of a pre-stage data buffer;

first identification data extracting means coupled with said first data transmission path for extracting only the identification data of at least one of the data packets being transmitted on said first data transmission path;

second identification data extracting means coupled with said second data transmission path for extracting only the identification data of at least one of the data packets being transmitted on said second data transmission path;

determining means for comparing the identification data rom said first identification data extracting means and the identification data from said second identification data extracting means and for determining whether or not the identification data being transmitted on said first data transmission path and the identification data being transmitted on said second data transmission path are associated with each other; and data packet reading means for reading at least one of the data packets which have been determined by said determining means to be associated with each other.

2. An associative storage in accordance with claim 1, wherein said data packet reading means includes means for producing a single data packet based on data packets being transmitted, respectively, on said first data transmission path and said second data transmission path.

3. An associative storage in accordance with claim 2, wherein said means for producing a single data packet includes combining means for combining at least a portion of the data packet being transmitted on said first data transmission path with at least a portion of the data packet being transmitted on said second data transmission path.

4. An associative storage in accordance with claim 3, wherein said combining means includes joining means for joining said first and second data transmission paths to achieve said combination of at least a portion of a data packet being transmitted on said first data transmission path and at least a portion of a data packet being transmitted on said second data transmission path, the new data packet thus produced being returned to at least one of said first and second data transmission paths.

5. An associative storage in accordance with claim 1, wherein said determining means includes comparing means for comparing the identification data extracted by said first and second identification data extracting means.

6. An associative storage in accordance with claim 5, further comprising means for making the data packet being transmitted on one of said first and second data transmission paths wait until a data packet which is associated therewith is transmitted on the other of said first and second data transmission paths.

7. An associative storage in accordance with claim 6, wherein said means for making wait includes stopping means for stopping a shift operation of data on said asynchronous self-running type shift register constituting said one of said first and second data transmission paths.

8. An associative storage in accordance with claim 1, wherein data packets are transmitted on said first data transmission path in a direction opposite to the direction of data packet transmission on said second transmission path.

9. An associative storage in accordance with claim 8, wherein at least one of said first and second data transmission paths is formed on a loop fashion and data packets on said one data transmission path are circulated on said loop-fashioned data transmission path.

10. An associative storage in accordance with claim 1, wherein said first and second identification data extracting means are connected to one or more of said data buffers of said first and second data transmission paths so as to form first and second identification data detecting sections, respectively.

11. An associative storage in accordance with claim 10, wherein said first identification data detecting section includes a plurality of first identification data detecting sections coupled with said first data transmission path, and said second identification data detecting section includes one second identification data detecting section coupled with said second data transmission path, said first identification data extracting means extracting a plurality of the identification data in respective ones of said plurality of first identification data detecting sections and said second identification data extracting means extracting one of the identification data in said second identification data detecting section.

12. An associative storage in accordance with claim 1, wherein said determining means includes a plurality of comparing means for comparing the identification data in association with said plurality of first identification data detecting sections, the identification data extracted by said first identification data extracting means in each of said plurality of said first identification data detecting sections and the identification data extracted by said second identification data extracting means in said second identification data detecting section being compared with each other by each of said plurality of comparing means.

13. An associative storage in accordance with claim 10, wherein said first identification data detecting section includes a plurality of first identification data detecting sections coupled with said first data transmission path, and said second identification data detecting section includes a plurality of second identification data detecting sections coupled with said second data transmission path, said first identification data extracting means extracting a plurality of the identification data in respective ones of said plurality of first identification data detecting sections, and said second identification data extracting means extracting a plurality of the identification data in respective ones of said second identification data detecting sections.

14. An associative storage in accordance with claim 13, wherein said determining means includes a plurality of comparing means for comparing the identification data in association with said plurality of first and second identification data detecting sections, the identification data extracted by said first identification data extracting means in each of said plurality of said first identification data detecting sections and the identification data extracted by said second identification data extracting means in each of said second identification data detecting sections being compared with each other by each of said plurality of comparing means.

15. An associative storage in accordance with claim 1, wherein said self-running shift registers of said first and second transmission paths each have means for detecting vacancy of one of said data buffers, said detecting means including an associated coincidence element, said self-running shift registers each further having means responsive to said associated coincidence element detecting vacancy for transferring the data packets between data buffers in the bit parallel fashion.

16. An associative storage device for data packets each including bits of identification data and a plurality of additional bits of data associated with and yet different from the identification data, comprising:

first data transmission path means for transmitting the data packets, said first data transmission path means including a plurality of bit-parallel data buffers interconnected in a cascade fashion so as to constitute a multi-state, asynchronous, self-running shift register in which the data packets are sequentially shifted in a bit-parallel fashion in response to vacancy of a pre-stage data buffer;

second data transmission path means for transmitting the data packets, said second data transmission path means including a plurality of bit-parallel data buffers interconnected in a cascade fashion so as to constitute a multi-stage, asynchronous, self-running shift register in which h data packets are sequentially shifted in a bit-parallel fashion in response to vacancy of a pre-stage data buffer;

first identification data extracting means coupled with said first data transmission path for extracting only the identification data of at least one of the data packets being transmitted on said first data transmission path;

second identification data extracting means coupled with said second data transmission path for extracting only the identification data of at least one of the data packets being transmitted on said second data transmission path;

determining means for comparing the identification data rom said first identification data extracting means and the identification data from said second identification data extracting means and for determining whether or not the identification data being transmitted on said first data transmission path and the identification data being transmitted on said second data transmission path are associated with each other; and packet producing means for producing a single data packet based upon the data packets which have been determined by said determining means to be associated with each other.

17. An associative storage according to claim 16, wherein said self-running shift registers of said first and second transmission paths each have means for detecting vacancy of one of said data buffers, said detecting means including an associated coincidence element, said self-running shift registers each further having means responsive to said associated coincidence element detecting vacancy for transferring the data packets between data buffers in the bit parallel fashion.

* * * * *